(12) United States Patent
Juchem et al.

(10) Patent No.: US 12,061,248 B2
(45) Date of Patent: Aug. 13, 2024

(54) MAGNETIC RESONANCE IMAGER WITH COILS FOR ARBITRARY IMAGE SPACE AND FABRICATION THEREOF

(71) Applicant: The Trustees of Columbia University in the City of New York, New York, NY (US)

(72) Inventors: Christoph Juchem, Ridgefield, CT (US); Michael Sebastian Theilenberg, New York, NY (US); Yun Shang, New York, NY (US); Jalal Ghazouani, Hamburg (DE)

(73) Assignee: The Trustees of Columbia University in the City of New York, New York, NY (US)

( * ) Notice: Subject to any disclaimer, the term of this patent is extended or adjusted under 35 U.S.C. 154(b) by 96 days.

(21) Appl. No.: 17/649,462

(22) Filed: Jan. 31, 2022

(65) Prior Publication Data

US 2022/0155391 A1     May 19, 2022

Related U.S. Application Data

(63) Continuation of application No. PCT/US2020/044752, filed on Aug. 3, 2020.
(Continued)

(51) Int. Cl.
    *G01R 33/385*        (2006.01)
    *G01R 33/3875*      (2006.01)

(52) U.S. Cl.
    CPC ..... *G01R 33/3858* (2013.01); *G01R 33/3856* (2013.01); *G01R 33/3875* (2013.01)

(58) Field of Classification Search
    CPC ............ G01R 33/3858; G01R 33/3856; G01R 33/3875; G01R 33/385
    See application file for complete search history.

(56) References Cited

U.S. PATENT DOCUMENTS 4,245,206 A * 1/1981 Daikoku ................. H01F 27/08
                                                                     336/185
4,299,025 A    11/1981 Lauer et al.
(Continued)

FOREIGN PATENT DOCUMENTS

CA        2851959 A1 * 5/2013 ........... B29C 39/003
CN      107219480 A * 9/2017

OTHER PUBLICATIONS

Littin et al., Development and implementation of an 84-channel matrix gradient coil, Magn Reson Med. Feb. 2018;79(2):1181-1191 (Year: 2018).*
(Continued)

*Primary Examiner* — Daniel R Miller
(74) *Attorney, Agent, or Firm* — Wolter Van Dyke Davis, PLLC; Eugene J. Molinelli

(57) ABSTRACT

An apparatus for fabricating non-planar coils includes a rotating table driven by a first motor; a wire approach height adjustment arm driven by a second motor; and a synchronization module configured such that a wire traversing from the height adjustment arm to a bobbin on the rotating table passes into a non-planar groove cut in the bobbin without damaging the wire. Performing magnetic resonance (MR) measurements includes a plurality of coil units configured for generating a gradient or shim magnetic field. The coil unit includes a plurality of coil windings, and each coil winding is separated longitudinally from an adjacent coil winding. A single pair of electrically conducting leads is configured to cause current to flow through all of the plurality of coil windings in the coil unit. Techniques include methods to fabricate and operate the apparatus.

12 Claims, 28 Drawing Sheets

Related U.S. Application Data

(60) Provisional application No. 62/881,724, filed on Aug. 1, 2019.

(56) References Cited

U.S. PATENT DOCUMENTS

| | | | |
|---|---|---|---|
| 5,419,503 A | 5/1995 | Watanabe et al. | |
| 2012/0068708 A1* | 3/2012 | Camp | G01R 33/341 |
| | | | 324/318 |
| 2013/0082707 A1 | 4/2013 | Biber et al. | |
| 2015/0076271 A1 | 3/2015 | Bonanni et al. | |
| 2016/0282431 A1* | 9/2016 | Dewdney | G01R 33/56563 |

OTHER PUBLICATIONS

Aghaeifar et al., Dynamic B0 shimming of the human brain at 9.4 T with a 16-channel multi-coil shim setup, Magn Reson Med. Oct. 2018;80(4):1714-1725 (Year: 2018).*

International Preliminary Report on Patentability received for PCT Patent Application No. PCT/US2020/044752, mailed on Feb. 10, 2022, 8 pages.

International Search Report and Written Opinion for International Patent Application No. PCT/US2020/044752 dated Nov. 30, 2020, pp. 1-11.

\* cited by examiner

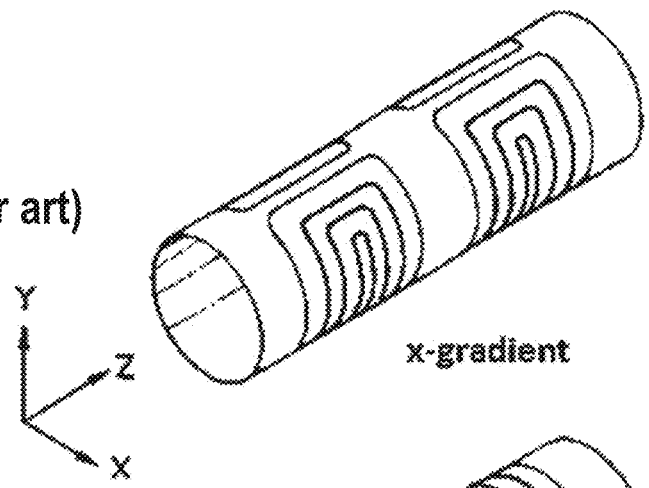
FIG. 2B (prior art) x-gradient
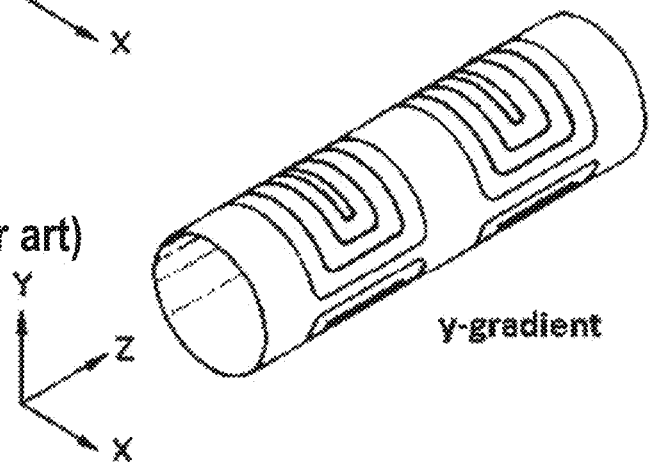
FIG. 2C (prior art) y-gradient
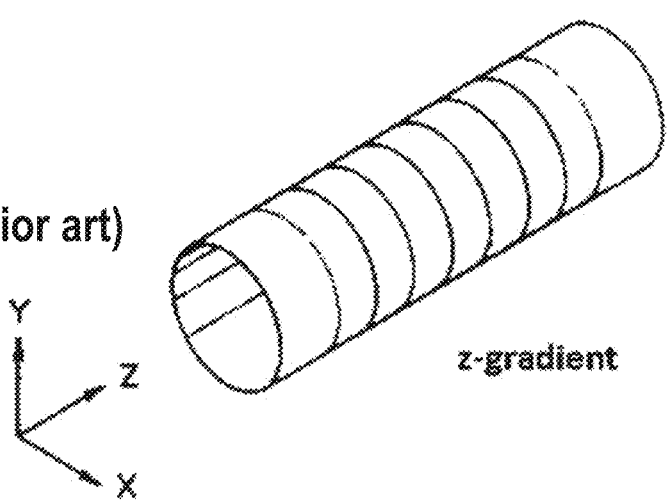
FIG. 2D (prior art) z-gradient

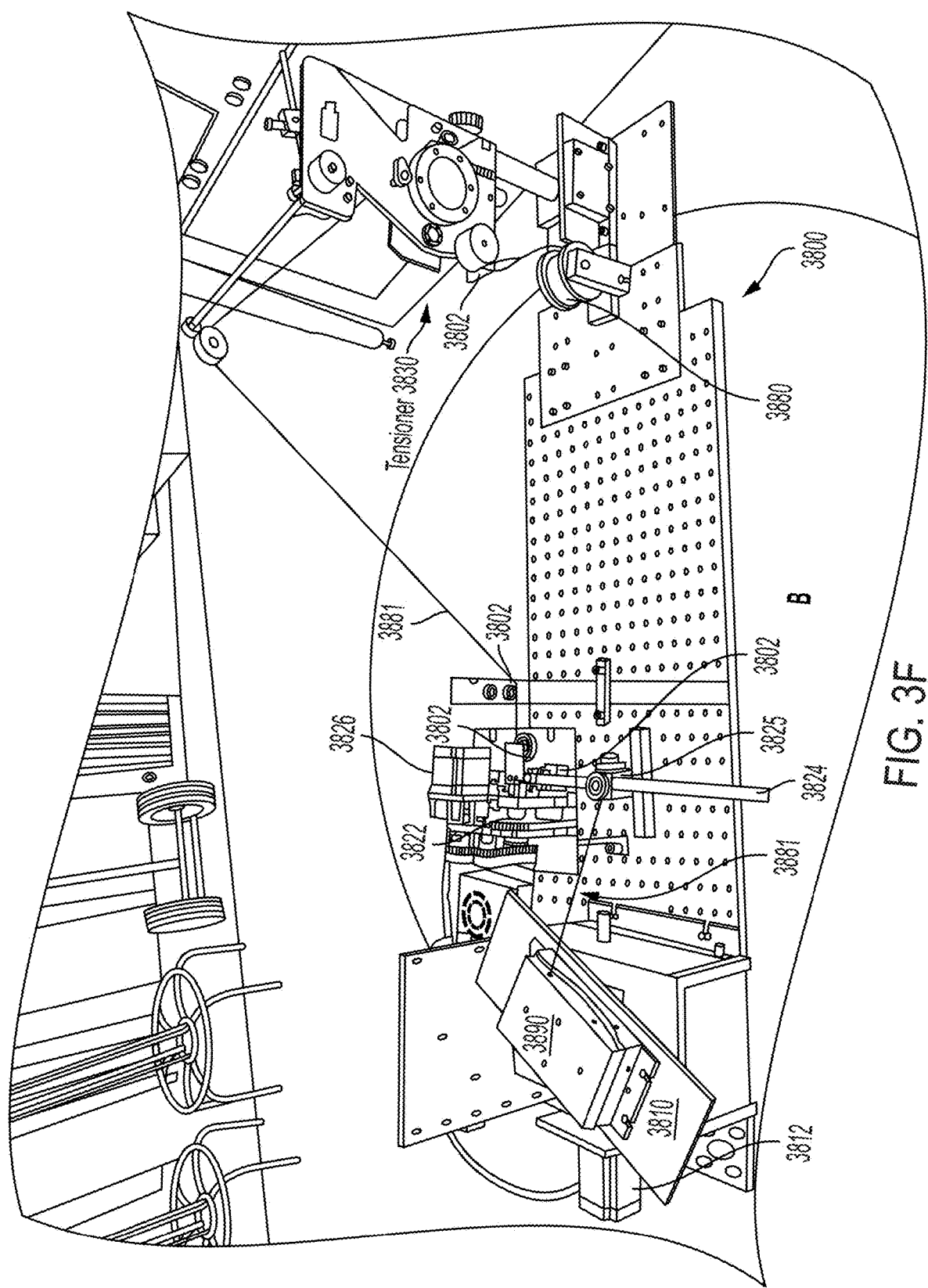

MAGNETIC RESONANCE IMAGER WITH COILS FOR ARBITRARY IMAGE SPACE AND FABRICATION THEREOF

CROSS-REFERENCE TO RELATED APPLICATIONS

This application is a continuation of PCT Application No. PCT/US20/44752 filed Aug. 3, 2020 which claims benefit, under 35 U.S.C. § 119(e), of Provisional Appln. 62/881,724, filed Aug. 1, 2019, and Provisional Appln. 62/936,854, filed Nov. 18, 2019, the entire contents of each of which are hereby incorporated by reference as if fully set forth herein.

STATEMENT OF GOVERNMENTAL INTEREST

This invention was made with government support under Grants MH105998 and EB025153 awarded by the National Institutes of Health. The government has certain rights in the invention.

BACKGROUND

The present invention relates to magnetic resonance imaging (MRI), magnetic resonance spectroscopy (MRS) and MRS imaging (MRSI), and in particular to magnetic resonance equipment suitable for an arbitrary image volume. In the following, the base magnetic field or static magnetic field may represent the combination of the external magnetic field and the macroscopic effects of the tissue susceptibility.

Nuclear magnetic resonance studies magnetic nuclei by aligning them with an applied constant magnetic field (B0) in direction z and perturbing this alignment using an alternating magnetic field (B1) at radio frequencies (called RF pulses), orthogonal to z. The resulting response to the perturbing magnetic field is the phenomenon that is exploited in magnetic resonance spectroscopy (MRS) and magnetic resonance imaging (MRI). Spatial distributions of the measured spectroscopy are determined by adding to B0, the strength in the z direction, a spatial gradient of the z direction magnetic field along each of three orthogonal coordinate dimensions (e.g., x, y and z) designated Gx, Gy, Gz, respectively.

The elementary particles, neutrons and protons, composing an atomic nucleus, have the intrinsic quantum mechanical property of spin. The overall spin of the nucleus is determined by the spin quantum number I. If the number of both the protons and neutrons in a given isotope are even, then I=0. In other cases, however, the overall spin is non-zero. A non-zero spin is associated with a non-zero magnetic moment, $\mu$, as given by Equation 1a.

$$\mu = \gamma I \tag{1a}$$

where the proportionality constant, $\gamma$, is the gyromagnetic ratio. It is this magnetic moment that is exploited in NMR. Without an external magnetic field, the spins are randomly oriented. In the presence of a magnetic field, nuclei that have a spin of one-half, like Hydrogen nuclei ($^1$H), have two possible spin states (aligned with the applied field, referred to as spin up, and anti-aligned, referred to as spin down) with respect to the external magnetic field. The interaction between the nuclear magnetic moment and the external magnetic field means the two states do not have the same energy. The energy difference between the two states is given by Equation 1b.

$$\Delta E = \hbar \gamma B_0 \tag{1b}$$

where $\hbar$ is Planck's reduced constant. While most atoms are still oriented randomly, in thermal equilibrium, more than average atoms will be in the lower energy state and fewer than average in the high energy state imparting a net magnetization vector in the direction of the applied external magnetic field.

Resonant absorption will occur when electromagnetic radiation of the correct frequency to match this energy difference is applied. The energy of photons of electromagnetic radiation is given by Equation 2.

$$E = hf \tag{2}$$

where f is the frequency of the electromagnetic radiation and $h = 2\pi\hbar$. Thus, absorption will occur when the frequency is given by Equation 3.

$$f = \gamma B_0/(2\pi) \tag{3}$$

The NMR frequency f is shifted by the 'shielding' effect of the surrounding electrons. In general, this electronic shielding reduces the magnetic field at the nucleus (which is what determines the NMR frequency). As a result, the energy gap is reduced, and the frequency required to achieve resonance is also reduced. This shift of the NMR frequency due to the chemical environment is called the chemical shift, and it explains why NMR is a direct probe of chemical structure. Gradually the high energy state nuclei lose their excess energy to the lower state nuclei and return to a random distribution at an exponential decay rate called the T1 relaxation time.

Applying a short electromagnetic pulse in the radio frequency range to a set of nuclear spins induces a transition between states of the spins. In terms of the net magnetization vector (which is due to the fact that while many nuclei are randomly arranged, there is some alignment in the spins, i.e., more nuclei have nuclear magnetic moments aligned than anti-aligned with the field), this corresponds to tilting the net magnetization vector away from its equilibrium position (aligned in the z direction along the external magnetic field, $B_0$). The out-of-equilibrium magnetization vector processes about the external magnetic field at the NMR frequency of the spins. This oscillating magnetization induces a current in a nearby pickup coil acting as a radio frequency (RF) receiver, creating an electrical signal oscillating at the NMR frequency.

A portion of this time domain signal (intensity vs. time), after all radio frequency pulses, is known as the free induction decay (FID) and contains the sum of the NMR responses from all the excited spins and all their chemical shielding effects. In order to obtain the frequency-domain NMR spectrum (intensity vs. frequency) for magnetic resonance spectroscopy (MRS) and MRS imaging (MRSI), this time-domain signal is Fourier transformed. After the RF pulse ends, the energy in the emitted FID signal decreases at an exponential rate called the $T_2$ relaxation time. The $T_2$ relaxation time is the e-folding time for precessing nuclei to fall out of alignment with each other (i.e., lose coherence) and thus a signal is reduced to 1/e of its initial amplitude.

Spectral resolution refers to the ability to distinguish two closely spaced peaks in any spectrum. It is one of the important criteria that define the quality of MRS and MRSI. Low spectral resolution can obscure the information available from molecules of interest, such as metabolites, in a volume of tissue, thus making difficult or impossible the detection and quantification of some or all of those metabolites.

Within the category of data acquisition, the most commonly employed strategy for improving spectral resolution is the automated techniques for improving the homogeneity of the magnetic field $B_0$. Fast and high order shimming techniques have been implemented on modern scanners to make B0 more uniform across a subject being scanned, yet these methods cannot eliminate all variation in local magnetic fields that are caused by the differing magnetic susceptibilities of various interposed tissues within the body. To image at higher magnetic field strengths is another strategy to increase spectral resolution, as well as improve the signal-to-noise ratio (SNR) of the MRS. Theoretically, doubling the field strength should double the differences in chemical shifts and the separation of peaks in the metabolic spectrum. Unfortunately, the observed benefit of higher field strengths in improving spectral resolution is much lower than theoretically predicted. For higher fields, such as 7 Tesla (T, 1 T=1 Newton per Ampere per meter) and above, there is substantially sub-linear spectral resolution improvement. Two reasons for this are that scanners with higher field strengths come with greater inhomogeneity of their magnetic fields, and the higher fields shorten the $T_2$ relaxation times of metabolites, both of which increase linewidths of the spectrum. In addition, the upper limit on field strength is constrained by practical and safety considerations. Techniques of fast acquisition of data can reduce the total scan time and thereby reduce the likelihood that the person being imaged moves, and this will indirectly reduce the line broadening caused by subject motion. Other acquisition-based techniques are designed to overcome these problems, as such higher spatial resolution MRSI is designed to address low spatial resolution, whereas 2 dimensional (2D) J-resolved MRSI overcomes the limited spectral resolution to improve spectral resolvability through a second spectral dimension. However, both of these techniques usually require long scan times which cannot be afforded in many clinical and research applications.

Magnetic resonance imaging presents just the initial amplitudes of the response; and, thus, trades off information about the time evolution (spectrum) in order to achieve much higher spatial resolution.

SUMMARY

Techniques are provided for improving magnetic field generation in MRI and MRSI applications among other applications. Several embodiments involve coils made of loops that are not co-planar. As used here, the term "co-planar coil" is one in which each individual loop of wire is flat and is said to reside in a single plane, and each subsequent individual loop of wire resides in the same plane or a parallel plane. As used herein, the term "non-planar coil" is a coil that is not a co-planar coil.

In a first set of embodiments, an apparatus for fabricating non-planar coils includes a rotating table driven by a first motor; a wire approach height adjustment arm driven by a second motor; and a synchronization module configured such that a wire traversing from the height adjustment arm to a bobbin on the rotating table passes into a non-planar groove cut in the bobbin without damaging the wire.

In a second set of embodiments, a system includes the apparatus of the first set of embodiments and the bobbin with the non-planar groove cut in the bobbin.

In a third set of embodiments, an apparatus for performing magnetic resonance (MR) measurements includes a coil unit configured for generating a gradient or shim magnetic field or both. The coil unit includes a plurality of coil windings each winding comprising a plurality of loops of electrically insulated electrically conducting wire. Each coil winding defines a perpendicular longitudinal axis; and, each coil winding is separated longitudinally parallel to the axis by a longitudinal gap from an adjacent coil winding. A single pair of electrically conducting leads is configured to cause current to flow through all of the plurality of coil windings in the coil unit.

In some embodiments of the third set, each coil winding is comprised of about 100 loops of the wire and the longitudinal gap is about 4 millimeters. In some embodiments of the first set, the electrically insulated electrically conducting wire is embedded in a thermally conductive material.

In some embodiments of the third set, a multi-coil (MC) subsystem includes multiple coil units. The multiple coil units form a shell that at least partially encloses a MR measurement space. In some of these embodiments, each coil unit has at least one cooling tube passing through the gap in the coil unit.

In other embodiments, a method or a computer-readable medium or computer system is configured to fabricate or operate one or more of the above coil units.

Still other aspects, features, and advantages are readily apparent from the following detailed description, simply by illustrating a number of particular embodiments and implementations, including the best mode contemplated for carrying out the invention. Other embodiments are also capable of other and different features and advantages, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

Embodiments are illustrated by way of example, and not by way of limitation, in the figures of the accompanying drawings in which like reference numerals refer to similar elements and in which:

FIG. 2B through FIG. 2D, are block diagrams that illustrate example coils distributed around the bore hole of FIG. 2A, which can serve as x-gradient, y-gradient and z gradient coils in the z-directed magnetic field, according to prior art;

FIG. 3F is a photograph that illustrates an example non-planar coil fabrication system, according to an embodiment.

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements at the time of this writing. Furthermore, unless otherwise clear from the context, a numerical value presented herein has an implied precision given by the least significant digit. Thus, a value 1.1 implies a value from 1.05 to 1.15. The term "about" is used to indicate a broader range centered on the given value, and unless otherwise clear from the context implies a broader range around the least significant digit, such as "about 1.1" implies a range from 1.0 to 1.2. If the least significant digit is unclear, then the term "about" implies a factor of two, e.g., "about X" implies a value in the range from 0.5× to 2×, for example, about 100 implies a value in a range from 50 to 200. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Some embodiments of the invention are described below in the context of imaging the human head. However, the invention is not limited to this context. In other embodiments, the coil units described herein are used in different assemblies. e.g., assemblies to image other arbitrary spaces, one-sided open or enclosed, such as suitable for a particular organ or hand or foot or non-human animal or manufactured part.

Figure 1:
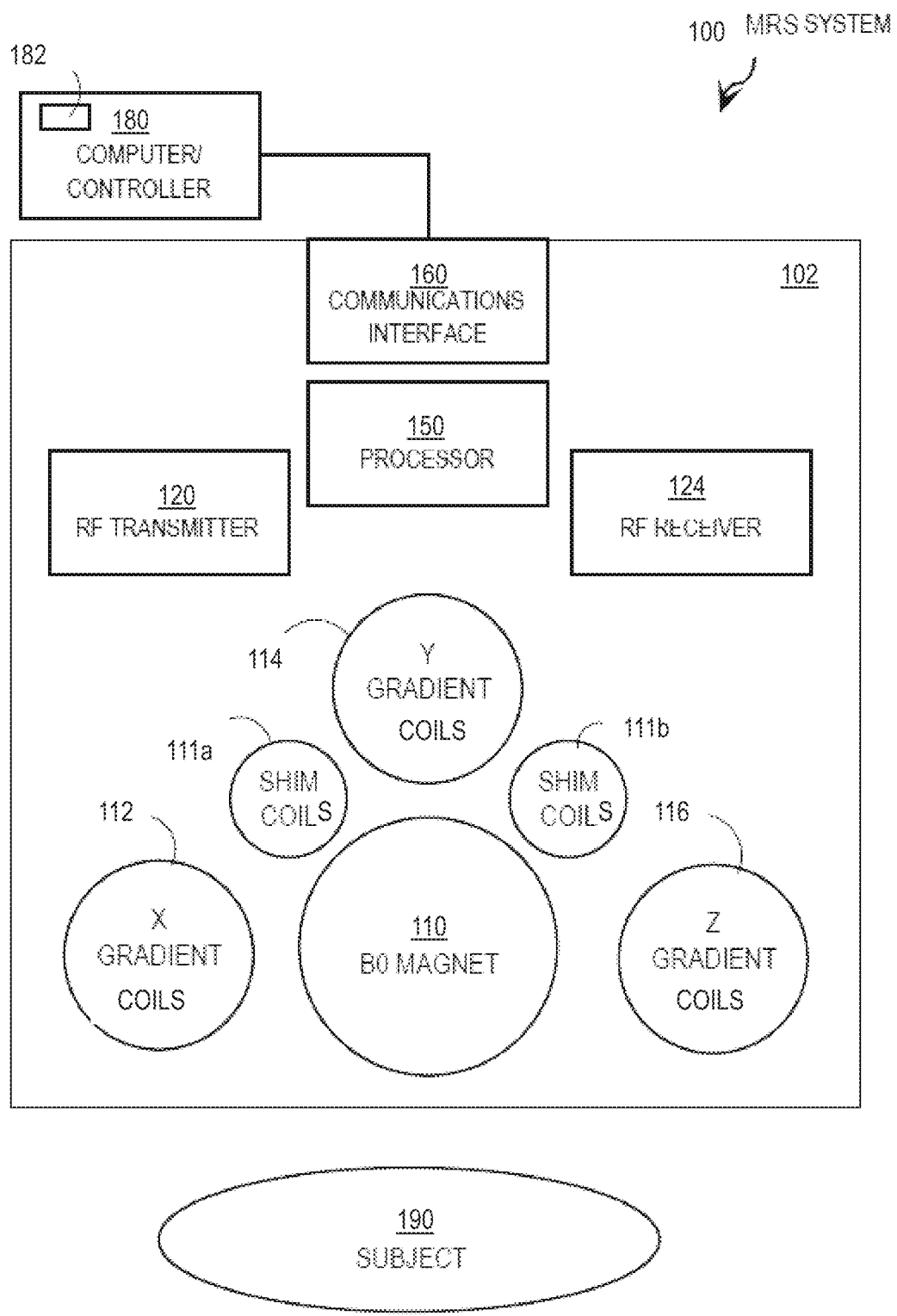
FIG. 1 is a block diagram that illustrates an example MR system, according to an embodiment.

In various embodiments, one or more gradient coils or steps of the method described below are incorporated into an MR scanning system or apparatus. FIG. 1 is a block diagram that illustrates an example MR system 100, according to an embodiment. The system 100 includes a scanning apparatus 102 and a computer/controller 180. Although a subject 190 for MR scanning is depicted in FIG. 1, subject 190 is not part of the MR system 100.

The scanning apparatus 102 includes a $B_0$ magnet 110, an x-gradient magnet 112, a y-gradient magnet 114, a z-gradient magnet 116, a group of shim coils (e.g., shim coils 111a and 111b), a radio frequency (RF) transmitter 120, an RF receiver 124, a communications interface 160, and a processor 150. In various embodiments, the coil units described herein each, or in some combination, replace in whole or in part one or more of magnet 110 and coils 111a, 111b, 112, 114, 116.

The computer/controller 180 sends signals to the communications interface 160 in scanner 102 that causes the scanner to operate the gradient magnets 112, 114 and 116 and the RF transmitter 120 and RF receiver 124 to obtain MRI or MRS data.

In the illustrated embodiment, computer/controller 180 includes module 182 to drive a multi-coil (MC) subsystem and process MR data produced as a result. Module 182 performs one or more steps of the method described below for operating gradient and shim coils in the course of imaging a target object, such as the human head, other organ, non-human animal, or tissue, or manufactured part. The collected data is received at computer/controller 180 or another computer and used to present or use a MR measurement.

Figure 8:
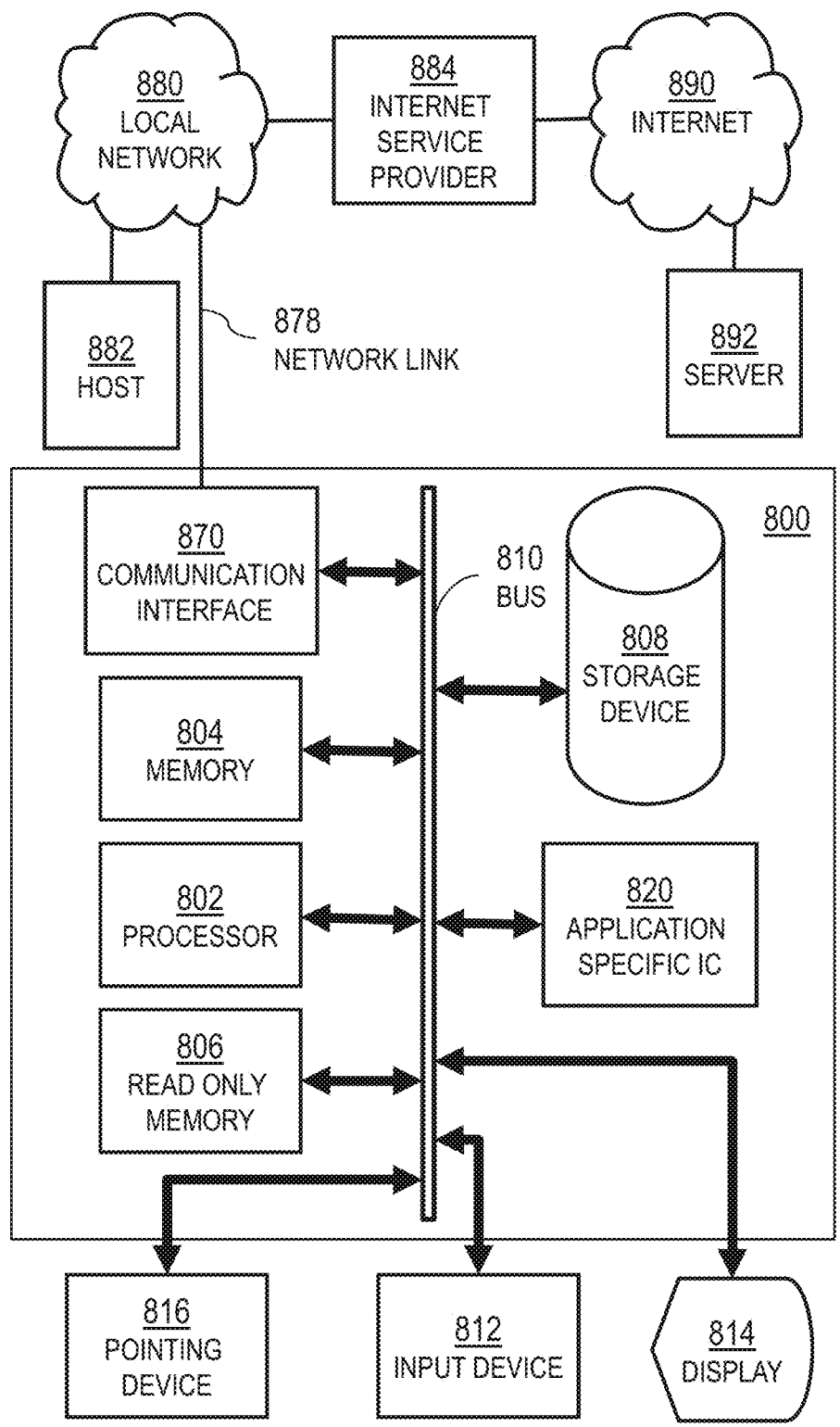
FIG. 8 is a block diagram that illustrates a computer system upon which an embodiment of the invention may be implemented.

In some embodiments, module 182 is included in processor 150 within scanner 102. In various embodiments, one or more steps of the method are performed by multiple processors on scanner 102 or computer/controller 180 or other computers connected to computer/controller 180 via a network, as depicted in FIG. 8.

Although processes, equipment, and data structures are depicted in FIG. 1 as integral blocks in a particular arrangement for purposes of illustration, in other embodiments one or more processes or data structures, or portions thereof, are arranged in a different manner, on the same or different hosts, in one or more databases, or are omitted, or one or more different processes or data structures are included on the same or different hosts.

Figure 2A:
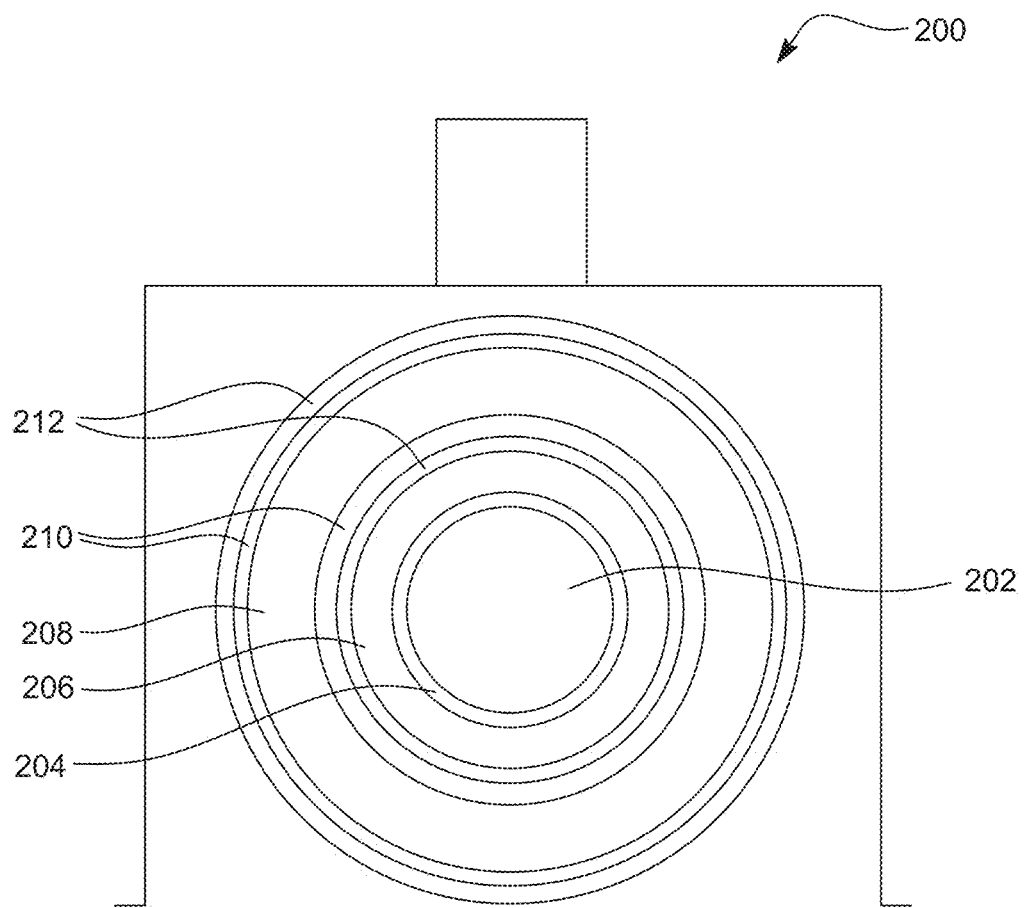
FIG. 2A is a block diagram that illustrates an example cross section of a MR system in a x-y plane perpendicular to the direction z of the magnetic field B0, according to prior art.

FIG. 2A is a block diagram that illustrates an example cross section of a prior art MR measurement system 200 in a x-y plane perpendicular to the direction z of the magnetic field $B_0$, upon which an embodiment may be implemented. The system 200 is roughly cylindrical with the z-direction field $B_0$ oriented along the rotational axis of symmetry for the cylinder. The scanner bore 202 is a cylindrical space into which a subject is inserted. Successively outward layers include RF transmit coil 204, the magnetic gradient coils 206, a superconducting primary electromagnetic coil 208 to provide the $B_0$ field between two cooling layers 210, e.g., filled with liquid helium, to cool the primary magnet to superconducting temperatures, and thermal insulation layers 212.

FIG. 2B through FIG. 2D, are block diagrams that illustrate example prior art coils distributed around the bore hole of FIG. 2A, which can serve as x-gradient, y-gradient and z gradient coils in the z-directed magnetic field, according to an embodiment. These coils occupy layer 206 in FIG. 2A. These coils are operated to determine the spatial distribution of the MR measurements during imaging.

It was recognized that the typical clinical MR measurement apparatus is too expensive and bulky for many clinically relevant applications. For example, imaging of the human head provides vast clinical benefits if widely available but does not require a full body imager. Thus, a challenge was issued to design an MRI device suitable for imaging the human head that is less bulky and expensive than a full body imager. In response, it was recognized that the gradient coils for a cylindrical space should be replaced with multiple smaller coils (so called multi-coils) to image a more suitable measurement space. Early designs called for a non-planar coil unit.

1. OVERVIEW

As described herein after initial work on multi-coils, it was recognized that an arrangement of a double coil unit with cooling tubes provide a versatile building block for imaging an arbitrary space, including the somewhat hemispherical space suitable for imaging the human head, and provides the performance needed to achieve clinically useful results in at least that context.

Figure 3A:
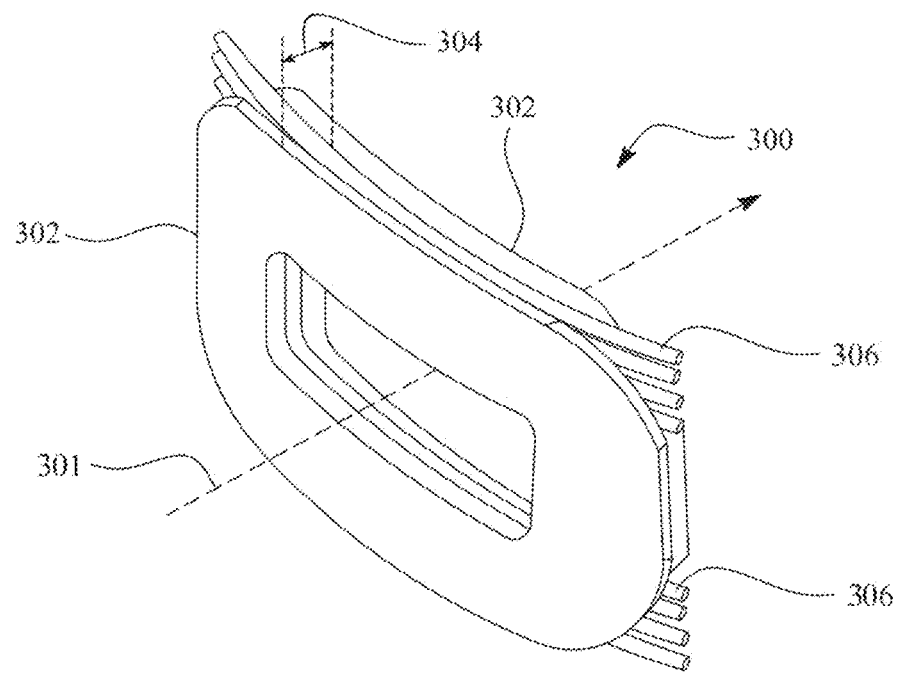
FIG. 3A is a perspective drawing that illustrates an example individual coil unit, according to an embodiment.

FIG. 3A is a perspective drawing that illustrates an example individual coil unit 300, according to an embodiment. The individual coil unit 300 is designed as a sandwich of two coil elements 302, each called a winding hereinafter, each winding composed of one or more wire loops. In some embodiments, a coil unit comprises more than two such coil elements. The windings are electrically connected in series. To avoid short circuits the wire is electrically insulated. Note that the windings 302 define a longitudinal axis 301 approximately perpendicular to the loops in each winding. Note also that in the illustrated embodiment, the windings 302 are non-planar to conform to a curved shell that will be constructed by assembling multiple such coil units to enclose, at least in part, a MR measurement space. This means the windings 302 are not exactly perpendicular to the axis 301. However, each winding is configured to provide a circulating current that induces a spatially specific localized magnetic field. Thus, one pair of leads is used to send an electric current through all windings 302 of a single coil unit 300.

A gap 304 in the longitudinal direction, parallel to the longitudinal axis 301, is included between the two sandwiching elements 302; and, is used for placement of cooling tubes 306 for cooling of the coil elements 302. In an example embodiment the gap is 4 millimeters (mm, $1\ mm = 10^{-3}$ meters) for water cooling tubes. Although water is used in example embodiments described below, in other embodiments other cooling fluids, including either or both liquid or gas, are used, depending on the heat capacity and flow rates that are advantageous for any particular embodiment of heat producing coil elements, as can be determined by routine experimentation.

The gap also provides an advantage for inductance management. Generally, the higher the inductance of a coil, the harder it is to change its current, e.g., more voltage or energy is needed; or, with a given voltage supply, the time to change the current increases. This directly influences the maximum slew rate of a system of such coils. A decreased inductance was found with increased gap between the two sandwich elements, likely originating in the fact that with a larger gap the shared magnetic flux between wire turns in different sandwich elements, which directly influences the inductance, decreased from 100%.

In general, two or more windings can be connected in series. Thus, a coil unit includes a plurality of coil windings of electrically insulated electrically conducting wire, each coil winding approximately perpendicular to a single longitudinal axis, each coil winding separated longitudinally parallel to the axis by a longitudinal gap from an adjacent coil winding. Also, in general, a single pair of electrically conducting leads are configured to cause current to flow through all of the plurality of coil windings. In some embodiments, each coil winding is non-planar.

Figure 3B:
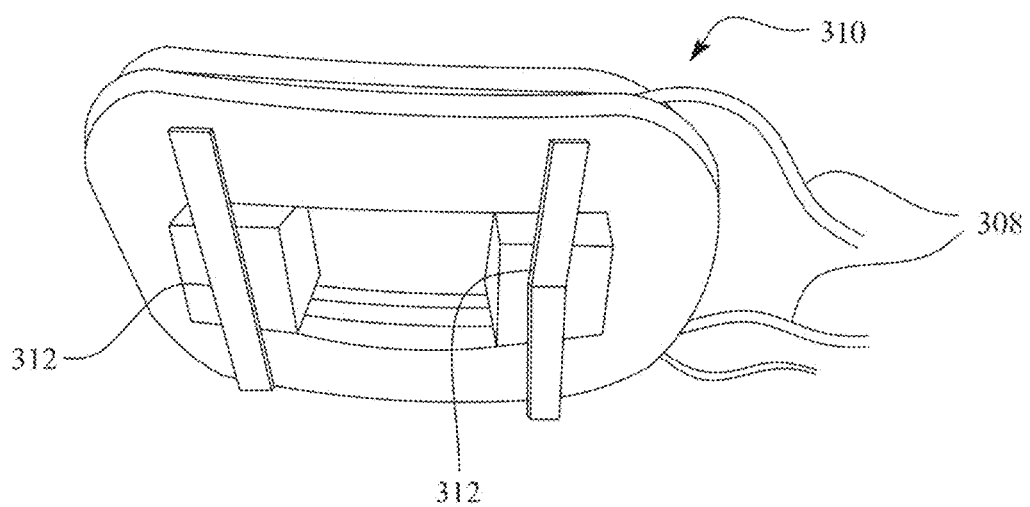
FIG. 3B is a perspective drawing that illustrates an example epoxy wet wound unit with temporary winding guides, according to an embodiment.

In the example embodiment, each sandwich element is wet wound with epoxy resin in an aluminum form and cured in the final shape after winding. FIG. 3B is a perspective drawing that illustrates an example epoxy wet wound unit 310 with temporary winding guides 312, according to an embodiment. In FIG. 3B, the guides 312 are temporary 3D printed plastic spacers to hold the two sandwich elements in place for testing. These are not needed for the fabrication winding process, nor will they be present in a final MC setup. In some embodiments, the winding is done on a different frame that is incorporated into the final subsystem. The guides 312 also provide the gap 304 between the two coil elements 302 for later placement of the cooling tubes 306. Epoxy resin filled with oxides is used to increase thermal conductivity of the coil elements to better exchange heat with the fluid in the cooling tubes. The two sandwiching elements 302 as well as the lead wires 308 to these coil elements are electrically connected using wires. For example, the lead wires 308 are directly soldered to the solid copper magnet wire used in the sandwich elements.

Whether the coil is co-planar or non-planar, each loop revolves around a center longitudinal axis that defines a direction called herein a local vertical direction, along which distance is called height. A plane perpendicular to this axis is called a local horizontal plane. The apparatus and system for fabricating such coils are described herein in terms of local horizontal and local vertical directions as relative terms. There is no requirement that the horizontal and vertical directions have any particular relationship to the local gravitational field.

It is here noted that gradient and shim coils commonly used in MRI are subject to significant Lorentz forces when switched due to the strong magnetic fields (1.5 T and above). Such coils are therefore usually fixated by e.g. epoxy resin during manufacturing. These curved coils are commonly manufactured by creating a flat coil that is subsequent bent to the target shape (e.g. a cylinder) and then fixated in the final geometry. For this process, the coil either needs to be single-layered so that the epoxy can be applied as an additional layer, or a resin with low viscosity has to be used so that it can flow between the layered wires (so-called infusion). Flat coils can also be fixated during the winding process by wetting the wire while guiding it into place (wet-winding). However, those prior art approaches were not suitable for the non-planar coils and heat conductive epoxy desired for the application at hand.

The proof of concept experimental multi-coils were manually produced using a tedious process that does not scale well for high volume production. However, conventional coil winding devices all assumed planar winding, either preceded by an epoxy coating or followed by diffusion of epoxy, and subsequent shaping by bending. In addition, various embodiments use a filled epoxy resin that has superior thermal conductivity. These resins have a relatively high viscosity so that an infusion process is not possible. Once the resin is cured, it is impossible to bend a flat coil to the desired shape without breaking it. Therefore, a special tool was designed to manufacture wet-wound non-planar coils. The design of this machine can handle coil geometries with different sizes and shapes for various different surfaces.

1.2 Fabrication of Non-Planar Coil Units

Figure 3C:
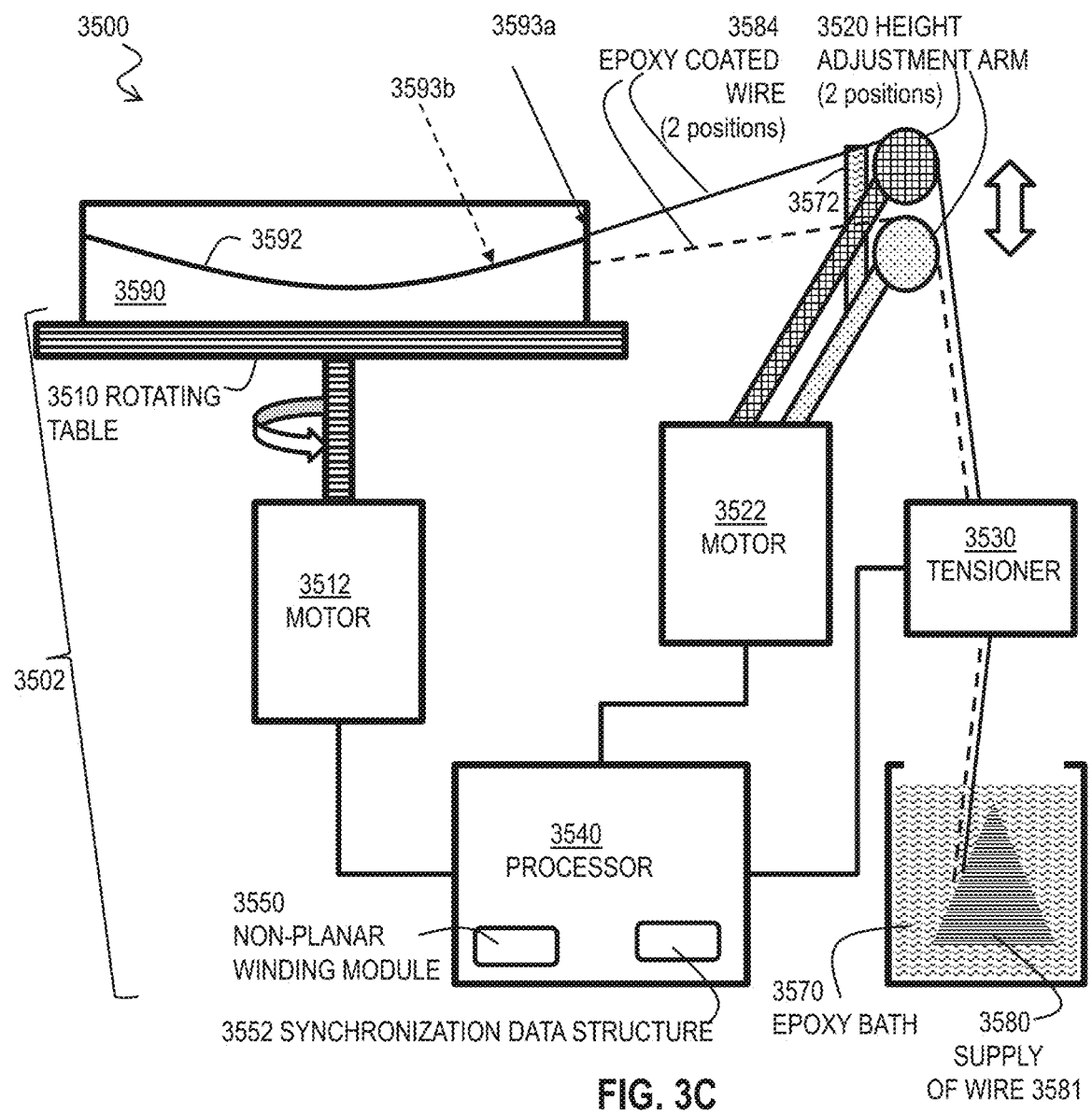
FIG. 3C is a block diagram that illustrates an example system for fabricating a non-planar coil winding for a multi-coil subsystem, according to an embodiment.

FIG. 3C is a block diagram that illustrates an example system 3500 for fabricating a non-planar coil winding for a multi-coil subsystem, according to an embodiment. The system 3500 includes a computer controlled winding apparatus 3502, a bobbin 3590, an insulated electrical wire supply 3580, and an epoxy supply, such as a bath 3570 or feed tank 3572.

The winding apparatus 3502 includes a rotating table 3510 driven by a motor 3512, and a wire approach height adjustment arm 3520 (also called a height arm, swinging arm, or rotary arm) driven by a motor 3522 synchronized with the motor 3512. The arm 3520 includes a low friction path for a wire, such as a pulley or a smooth channel with a non-stick coating. In the illustrated embodiment, the motors 3512 and 3522 are synchronized by non-planar module 3550 operating on processor 3540 (such as computer system described below with reference to FIG. 8 or chip set described below with reference to FIG. 9) and based on data in synchronization data structure 3552. The height adjustment arm 3520 changes in height as indicated by vertical double arrow as the rotating table 3510 rotates as indicated by turning arrow. The synchronization is configured such that a wire traversing from the height adjustment arm to a bobbin on the rotating table passes into a groove cut in the bobbin without damaging the wire, e.g., by scratching insulation off the wire. In some embodiments, the synchronization is provided by mechanical gears and linkages, alone or in concert with the non-planar winding module 3550.

The bobbin 3590 includes a groove 3592 that forms two opposing surfaces inside the bobbin. The opposing surfaces define a non-planar shape for a coil. The groove ends inside the bobbin at locations that correspond to a space inside the coil from the longitudinal axis to the first inner loop of the coil. Because the groove defines a non-planar surface, the groove intersects an outer edge of the bobbin 3590 on a non-horizontal, non-planar perimeter. Because of this, at different positions around the outside of the bobbin, the groove is at different heights. For example, at position 3593a the groove is at one height and at position 3593b the groove is at a different height. A wire (e.g., wire 3581) introduced into the bobbin 3590 at a constant height will kink as the wire enters the groove at one or both positions, possibly damaging the wire, e.g., by scratching the insulation of the wire or introducing a defect into the inner conducting core of the wire or adding friction that might lead to inconsistent packing of the loops in the coil to be produced. Thus, the arm 3520 is configured to adjust its height so that the wire 3581 enters the groove 3592 at different angles at the two positions 3593a and 3593b with different heights on the perimeter of the bobbin 3590.

The wire 3581 comes from a supply 3580 of insulated electrical wire, such as a spool of wire, and is fed into the groove 3592 of the bobbin 3590.

In some embodiments, the wire 3581 is coated with an epoxy, such as a thermally conductive epoxy, before being wound into the groove of the bobbin. The epoxy may be added by placing he spool into an epoxy supply bath 3570 or passing the wire past an epoxy feed tube from an epoxy feed tank 3572 somewhere along the route of the wire from supply 3580 to groove 3592. In some embodiments, the epoxy feed tank is attached to height adjustment arm 3520. Thus, in these embodiments, upon entering the groove 3592, the wire 3581 has already become an epoxy coated wire 3584.

Within the winding apparatus 3502, the height adjustment arm 3520 is configured to change the height of an electrical conducting wire 3581 so that it enters the groove without damage to the wire or without such friction that might lead to inconsistent packing. Thus, when the position 3593a is on the route of the epoxy coated wire 3584, the height adjustment arm is in a first position indicated by the solid fill arm and the wire is the in the position indicated by the solid line. At a different time, when the table has rotated so that position 3593b is on the route of the epoxy coated wire 3584, the height adjustment arm is in a different second position indicated by the dotted fill arm and the wire is the in the position indicated by the dashed line. The height adjustment arm 3520 is moved continuously or intermittently by motor 3522, such a vertical stepping motor, or the arm is on a pivot and the motor causes the arm to rotate continuously or intermittently to a different height, as shown in the example embodiment, described in more detail below.

In some embodiments, the winding apparatus 3502 also includes a wire tensioner 3530 to provide sufficient tension to ensure tight packing of the wire inside the bobbin 3590. In some embodiments, the tensioner 3530 is also controlled by processor 3540.

The bobbin also serves as a mold for the epoxy so that the epoxy sets in the desired non-planar shape. The material of the bobbin is selected to avoid adhering to the cured epoxy. The non-planar coil can then be removed from the bobbin and used in the multi coil system. For example, as described below with reference to FIG. 3E, the bobbin 3590 can be disassembled to release the cured winding or windings.

Different non-planar coils can be fabricated with the same apparatus by using different bobbins with different grooves. Each different bobbin will have different synchronization data in synchronization data structure 3552. In some embodiments, a special bobbin is used to generate both coils in the coil pair unit described above and depicted in FIG. 3B.

Figure 3D:
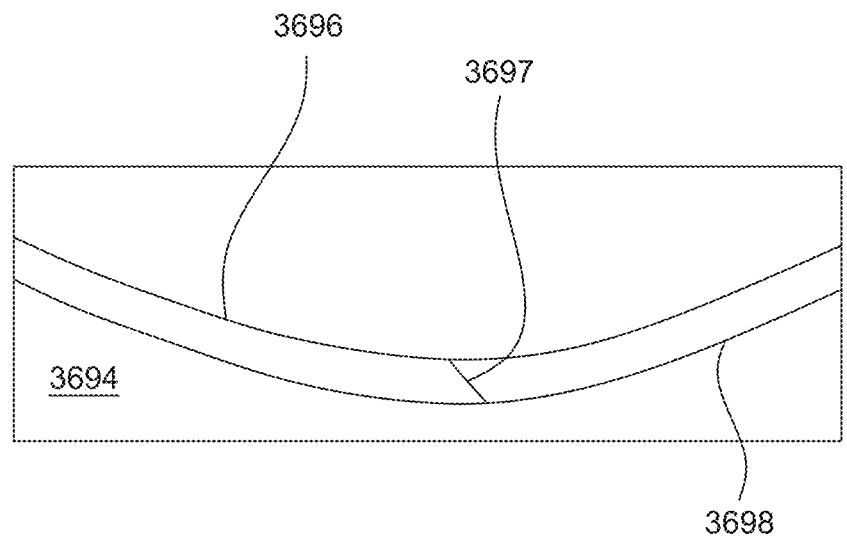
FIG. 3D is a block diagram that illustrates an example bobbin variation, according to an embodiment.

FIG. 3D is a block diagram that illustrates an example bobbin variation, according to an embodiment. In this embodiment, bobbin 3694 includes two different grooves 3696 and 3698 separated vertically with a connecting groove 3697. After winding one coil into groove 3696, the rotating table 3510 or height adjustment arm 3520 is moved vertically so that the epoxy coated wire 3584 passes through groove 3697 to groove 3698, and the second coil is wound into groove 3698.

Figure 3E:
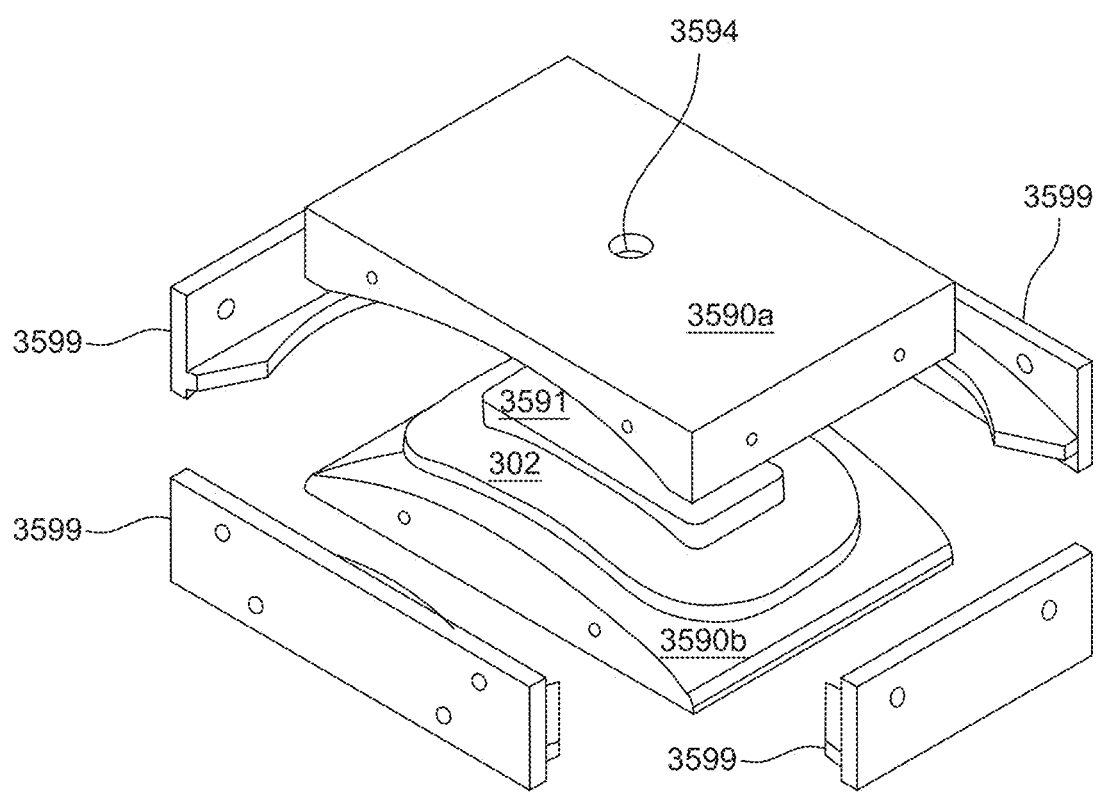
FIG. 3E is a perspective drawing that illustrates an exploded view of an example bobbin to extract a non-planar winding, according to an embodiment.

FIG. 3E is a perspective drawing that illustrates an exploded view of an example bobbin 3590 to extract a non-planar winding, according to an embodiment. The bobbin 3590 includes a first portion 3590a and a second portion 3590b that are fixed together with a fastener, such as a pin, screw, bolt or clip, which passes through one or more holes, such as hole 3594. The second portion 3590b includes an elevated sub-portion 3591 that serves as a form for the innermost loops of the winding 302. This sub-portion can also be fitted to a complementary recess (not shown) in the first portion to prevent relative rotation of the two portions during operation. During fabrication of winding 302, when the two portions 3590a and 3590b are reversibly fastened together to avoid relative rotation, the space between the first portion 3590a and the second portion 3590b and outside elevated sub-portion 3591 serves as the groove 3592 of the bobbin 3590. After fabrication, the fastener is removed from hole 3594 so that the first and second portions can be separated; and, the winding 302 can be removed. Side panels 3599 are used in some embodiments to hold the two portions of the bobbin together after winding and before removal of the winding, so the bobbin can be removed from the apparatus and set aside during or after a curing operation; or, for storage of bobbins between uses. In some embodiments, the side panels 3599 are attached to both the first and second portions 3590a and 3590b, respectively, with other fasteners through holes in the side panels and reciprocal holes in the first and second portions.

FIG. 3F is a photograph that illustrates an example non-planar coil fabrication system 3800, according to an embodiment. The system 3800 includes a wire supply 3880, a tensioner 3830, a wire 3881, a rotary arm 3824 with sliding member 3825 that together serve as height adjustment arm 3520, a rotating table 3810, motors 3812, 3826, for the rotating table 3810 and rotary arm 3824, respectively, with gearbox 3822 connecting the motor 3826 with the rotating arm 3824. The system 3800 also includes bobbin 3890 in which the second portion 3590b lies atop the first portion 3590a. Various pulleys 3802 and grooves serve to control the path of the wire on the tensioner and height adjustment arm. An epoxy tank and feed are omitted from this photograph.

Figure 3G:
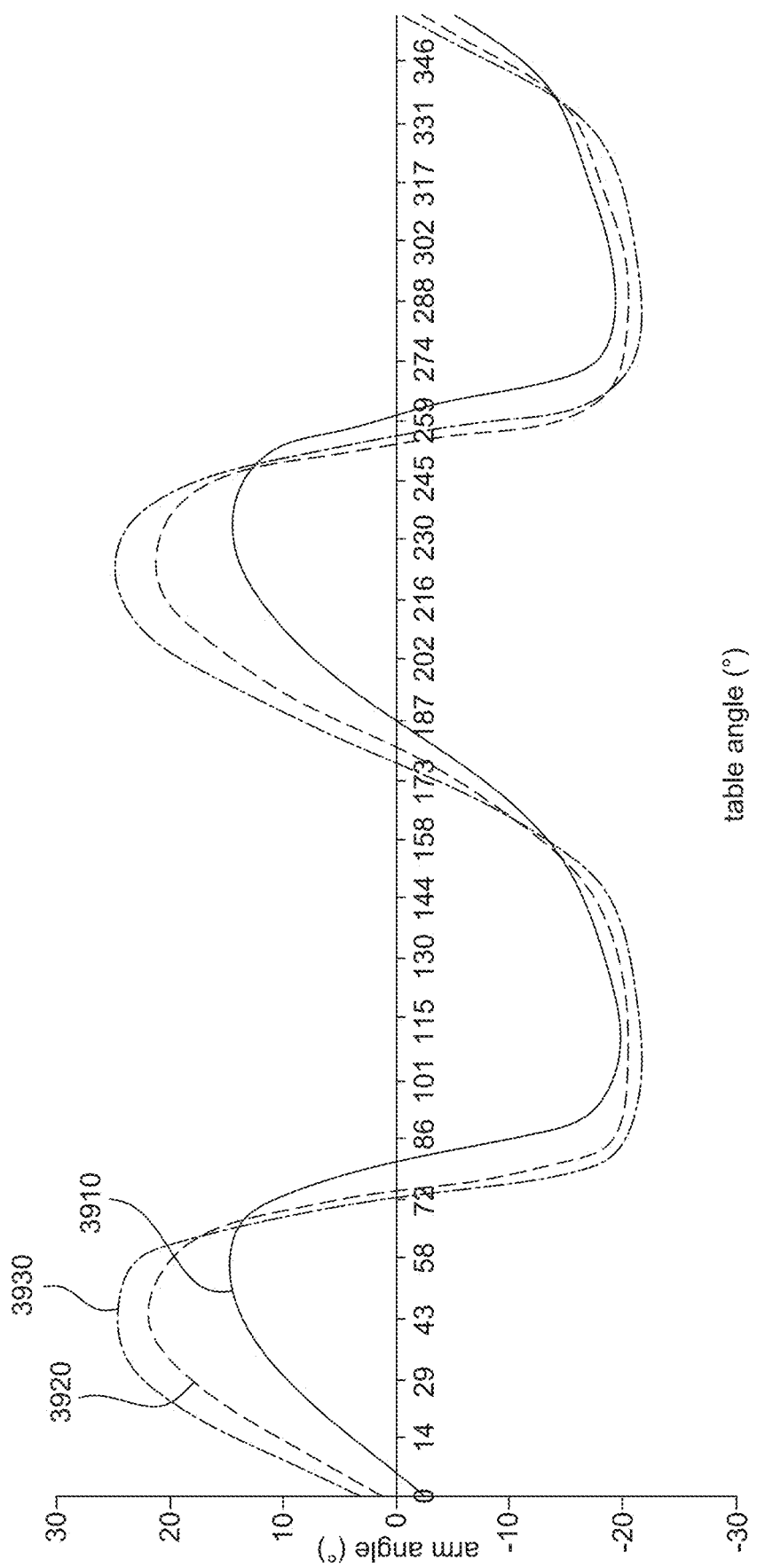
FIG. 3G is a plot that illustrates an example changes in height of arm during rotation of bobbin after multiple loops during fabrication of a winding, according to an embodiment

FIG. 3G is a plot that illustrates an example changes in height of arm during rotation of bobbin after multiple loops during fabrication of a winding, according to an embodiment. The horizontal axis indicates rotating table angle in degrees; and, the vertical axis indicates rotary arm angle in degrees relative to level. This plot shows data that provides synchronization of swinging (rotary) arm and table rotation. The optimal angle of the swinging arm was measured as a function of table orientation. Since the optimal angle depends slightly on the number of turns in the mold, e.g., the fraction of the mold already filled, three different curves were measured and coil winding was applied in 3 phases. In the first phase the maximum attack angle is smaller and increases with later phases; thus, phase 1 for loops 1 through 33 corresponds to trace 3910, phase 2 for loops 34 to 67 corresponds to trace 3920, and phase 3 for loops 68 to 100 corresponds to trace 3930.

Figure 3H:
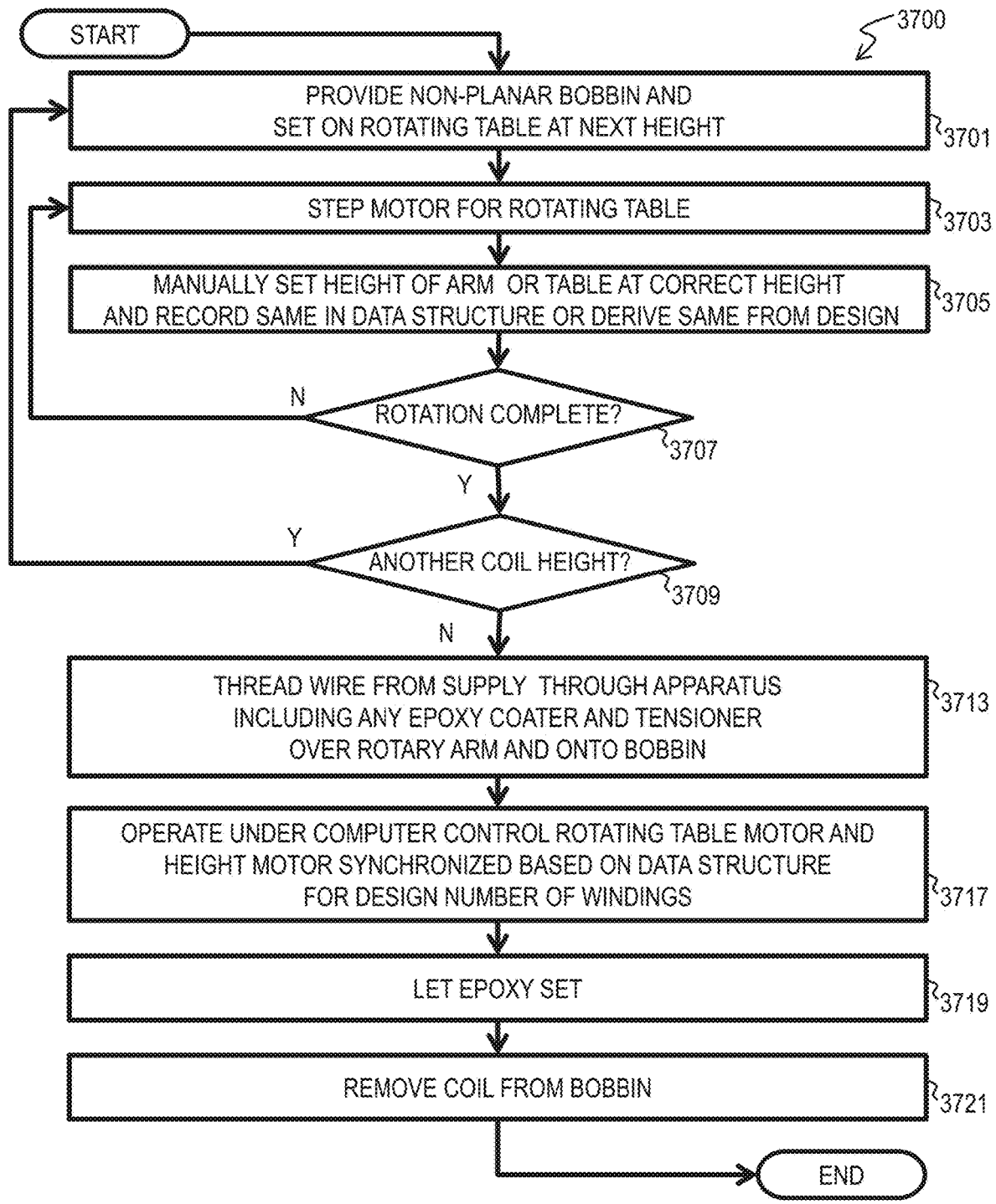
FIG. 3H is a flow diagram that illustrates an example method for operating a system of FIG. 3C, according to an embodiment.

FIG. 3H is a flow diagram that illustrates an example method for operating a system of FIG. 35, according to an embodiment. Although a method is depicted in FIG. 3H as a series of integral steps for purposes of illustration, in other embodiments, one or more steps, or portions thereof, are executed in a different order, in series or parallel, or are omitted or additional steps are added, or the method is changed in some combination of ways.

In step 3701, a bobbin with a non-planar groove (called non-planar bobbin for convenience, e.g., bobbin 3590 or 3694) is provided and placed on the rotating table 3510. In some embodiments, step 3701 includes threading a test wire into the groove of the bobbin.

Adjustment arm height data for the synchronization data structure 3552 is then accumulated manually in a loop of steps 3703 through 3709. In step 3703, the motor 3512 is operated to increment the rotation a small amount, such as 1 degree to 10 degrees. The first time that step 3703 is encountered, the bobbin is left in its initial placement position. In step 3705, the motor 3522 is operated manually to change the height of the height adjustment arm 3520 to reduce or eliminate any kinks in a wire (e.g., an imaginary wire or the test wire) as it enters the groove in the bobbin. When the kink is reduced or removed, data indicating a value of the height of the height adjustment arm 3520 is recorded in the synchronization data structure 3552 in association with data indicating a value for the current rotation angle of the rotating table 3510. In step 3707, it is determined whether the rotating table 3510 has complemented a full rotation within one rotational increment. If not, control passes back to step 3703 and 3705 to continue making measurements of height. If so, then a full rotation is complete.

In some embodiments, the height of the height adjustment arm is calculated automatically based on the shape of the bobbin groove and attributes (e.g., distances) of the components of device 3502. In such embodiments, step 3703 includes determining the height of the height adjustment arm as function of the rotation of the table 3510 for all 360 degrees of rotation in one step. In such embodiments, the initial positions of the table and angle is controlled by the motor and gear accurately. The reference position is fixed, the initial positions are set in the program. When the winding starts, the program will first move table and arm to the initial positions and then start winding.

In some embodiments, the synchronized height of the height adjustment arm depends on the number of turns already wound to the coil; and, the total number of turn, e.g. 100, is broken down into multiple ranges of turns and the height is calibrated for each range separately. As an example, one set of synchronized arm movements is used for turns 1-50, a 2nd set of synchronization info for turns 51-80 and a last set of synchronization heights for the last 20 turns, 81-100. If derived theoretically from geometric considerations based on the available CAD design, the example 3 representative settings is replaced by many more ranges, even turn-specific ranges of one turn, similar to a sliding calibration.

In some embodiments, in step 3709, it is determined whether there is another coil winding height (e.g., another groove in the bobbin, such as groove 3698 in bobbin 3694). If so, then control passes back to step 3701 to set the first rotation angle for the new height. In some embodiments, this includes changing the height of the rotation table or the height of the adjustment arm 3520. Steps 3703 through 3707 are then repeated for the second coil winding, e.g., second groove. If there are no further coil windings using the current bobbin, then the synchronization data structure is complete for these purposes and control passes to step 3713.

In step 3713, wire 3581 from the wire supply 3580 is threaded through the apparatus 3502 including any epoxy coater (e.g., bath 3570 or feed tank 3572) and any tensioner 3530 over height adjustment arm 3520 and into groove (e.g., 3592, 3696 or 3698) onto bobbin (e.g., 3590 or 3694).

In step 3717, under computer control rotating table motor and height motor are operated—synchronized based on data structure for design number of windings, e.g., 100 windings per coil.

In step 3719, the epoxy is allowed to set and in step 3721 the set non-planar coil is removed from the bobbin. For example, the bobbin separates into a first portion below the groove and a second portion above the groove, exposing the coil for easy removal. In embodiments in which the bobbin includes multiple grooves, each portion between grooves is also removable, e.g., split into two parts that can be removed horizontally.

The dimensions of each coil unit depend on the MR measurement to be made. The cooling rate to be provided by the cooling tubes is determined based on the heat generated by the multi-coils. The heat given off by a multi-coil depends on the resistance of the wire in the coil, the number of windings, and the current. In various embodiments, the coil unit shapes and arrangement are optimized for MC-generated $B_0$ field shapes considering specific aspects such as field accuracy, generation efficiency, limitation of heat and force generation as well as consideration of hardware limits such as maximum current per channel (e.g., per coil) or per amplifier bank e.g., per set of coils).

1.2 Magnetic Resonance Measurement System

Figure 4A:
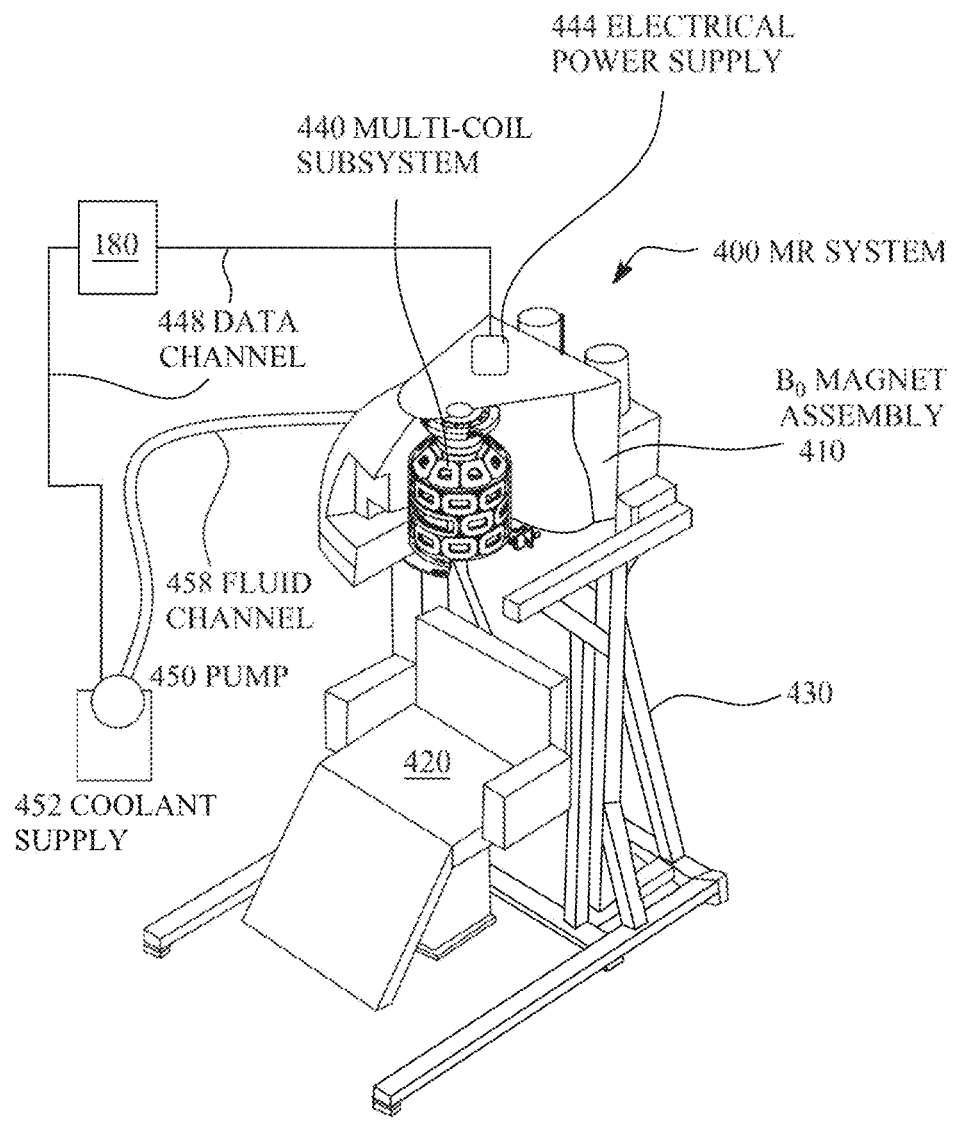
FIG. 4A is a block diagram that illustrates example placement of a multi-coil subsystem within a MR system, according to an embodiment.

FIG. 4A is a block diagram that illustrates example placement of a multi-coil subsystem 440 within a MR measurement system 400, according to an embodiment. The MR measurement system 400 includes a $B_0$ magnet assembly 410, a multi-coil subsystem specifically arranged for a particular purpose, a subject support structure 410, such as a chair for positioning a human subject, and a system support structure 430, including any mechanized components to move the other components relative to each other. Although FIG. 4A illustrates an embodiment suitable for performing MR measurements on the head of a human subject, in other embodiments the relative positions and shapes of the components, and shape of and number of units in the multi-coil subsystem 440 are designed for a different purpose, such as for more portability or for measurements of a different organ or subject, such as a manufactured part. In various embodiments, the multi-coil subsystem 440 is disposed near or inserted inside the $B_0$ magnet assembly, so that the $B_0$ magnetic field permeates the space inside the multi-coil subsystem, such as the somewhat hemispheric space inside the example multi-coil subsystem 440. It is anticipated that the $B_0$ magnet assembly includes a superconducting magnet that generates the strong $B_0$ magnetic field of use in MR measurements.

Also depicted in FIG. 4A is a computer system/controller 180, as depicted in FIG. 1, with wired or wireless data channel connections 448 to an electrical power supply 444 for the multi-coil subsystem 440. Also depicted is a coolant supply 452 and computer-controlled pump 450 connected to computer system 180 by at least one of the data channel connection 448. The pump 450 is configured to supply coolant fluid from supply 452 to the multi-coil subsystem via one or more fluid channels 458.

Figure 4B:
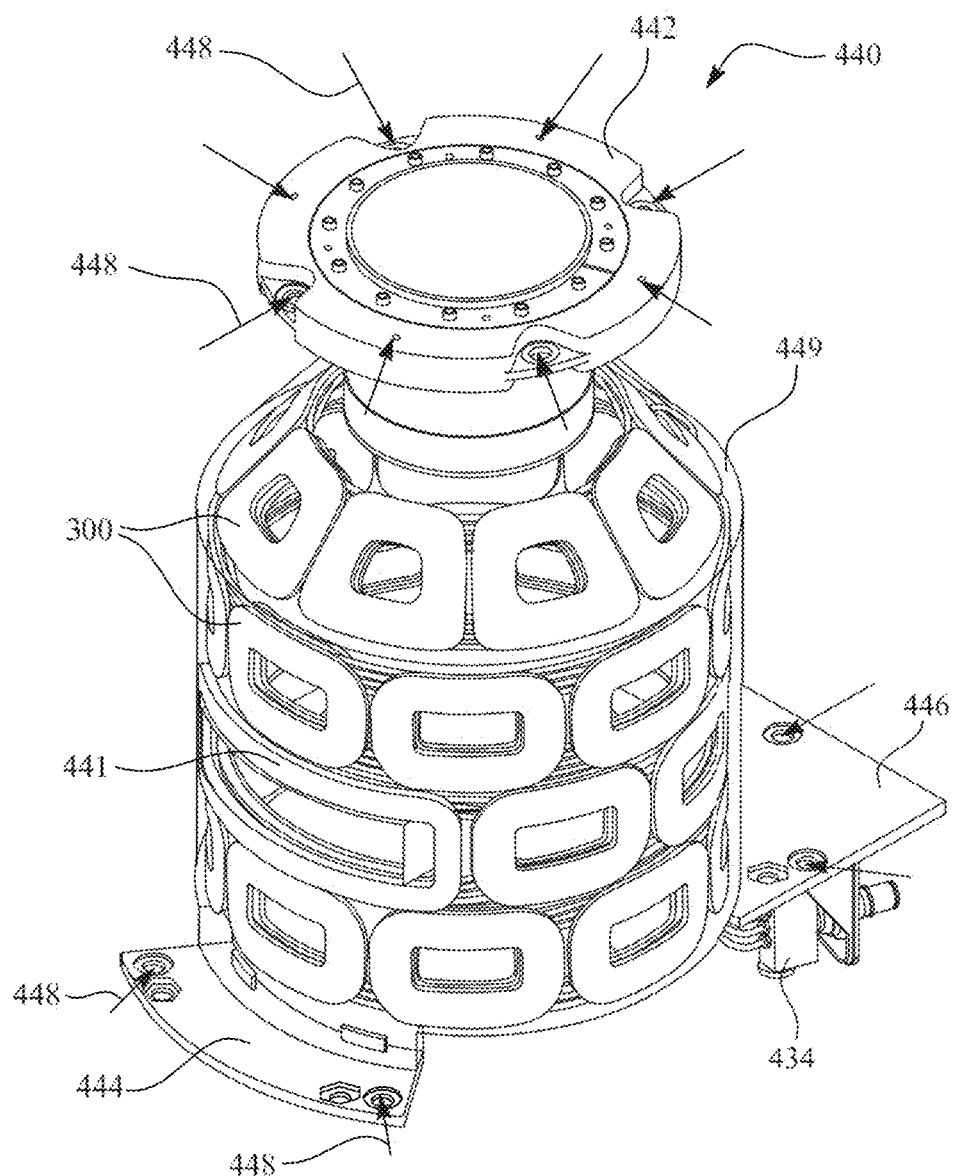
FIG. 4B is a block diagram that illustrates an example multi-coil subsystem including flanges for attachment to a $B_0$ magnet assembly, according to an embodiment.

FIG. 4B is a block diagram that illustrates an example multi-coil subsystem 440 including flanges for attachment to a $B_0$ magnet assembly 410, according to an embodiment. The subsystem includes multiple sandwich coil units 300, including a specially shaped unit 441 that is double the length of the other units 300 and positioned at the front of the subsystem 440 to allow room for eyes of a human patient to view outside the subsystem 440. The multi-coil subsystem 440 includes a casing 449 (also called a cast herein) for rigidity. Wires and cooling tubes are guided to the lower back of the unit and exit the casing as so-called wire pigtails or as the coolant inlet/outlet fixtures 434. In some embodiments, the plurality of lead pairs from the plurality of coil units are connected at each end an electrical panel at one limited portion of the cast.

A top flange 442 and bottom front flange 444 and bottom rear flange 446 are included and configured for removable attachment to the $B_0$ magnet assembly 410, so that the multi-coil subsystem 440 is inside a $B_0$ magnetic field produced by the assembly 410. Each flange has one or more through-holes 448 through which various fasteners can be used to secure the multi-coil subsystem 440 inside the $B_0$ magnet assembly 410.

Figure 4C:
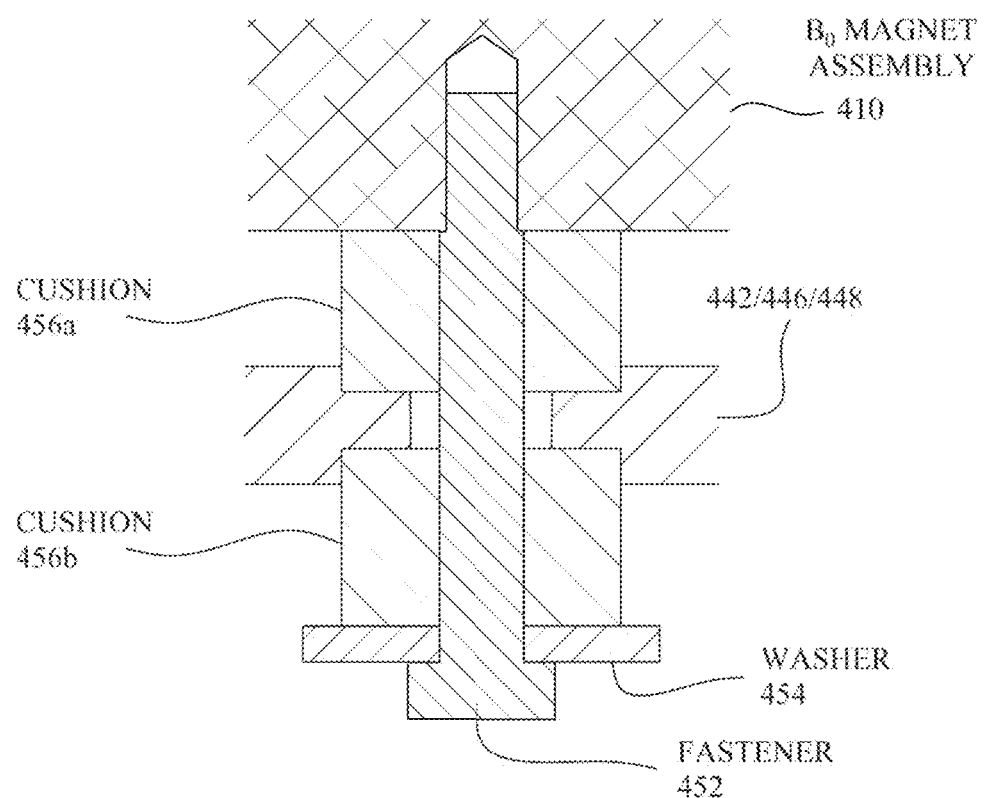
FIG. 4C is a block diagram that illustrates an example mounting detail, according to an embodiment.

Lorentz forces generated during switched application of coil current during MRI sequences are expected to induce vibrations of individual coil units 300, 441, or windings thereof, and the multi-coil subsystem 440. The subsystem 440 is therefore mechanically decoupled from the rest of the system to prevent these vibrations from traveling into the magnet body inside $B_0$ magnet assembly 410. To do so, each of the fasteners holding the multi-coil subsystem 440 employs two cushioning elements (also called "cushions" herein) that are compressed by the fastening torque applied during fastening with the fasteners. The cushioning elements thereby provide both mechanical damping and decoupling. FIG. 4C is a block diagram that illustrates an example mounting detail, according to an embodiment. A portion of the $B_0$ magnet assembly 410 is depicted along with a portion of one of the flanges 442 or 446 or 448 of the multi-coil assembly 440. A fastener 452, such as a bolt, with a built in or separate washer 454, applies pressure to two cushions 456a and 456b bracketing the flange 442 or 446 or 448. Any cushioning material that is effective at damping vibrations is suitable. In the example embodiment described below, the cushioning elements are made of rubber. In some embodiments, similar cushions are used for mounting an RF coil (decoupled similar to the magnet bore and rigid for more efficient usage of available space).

Figure 4D:
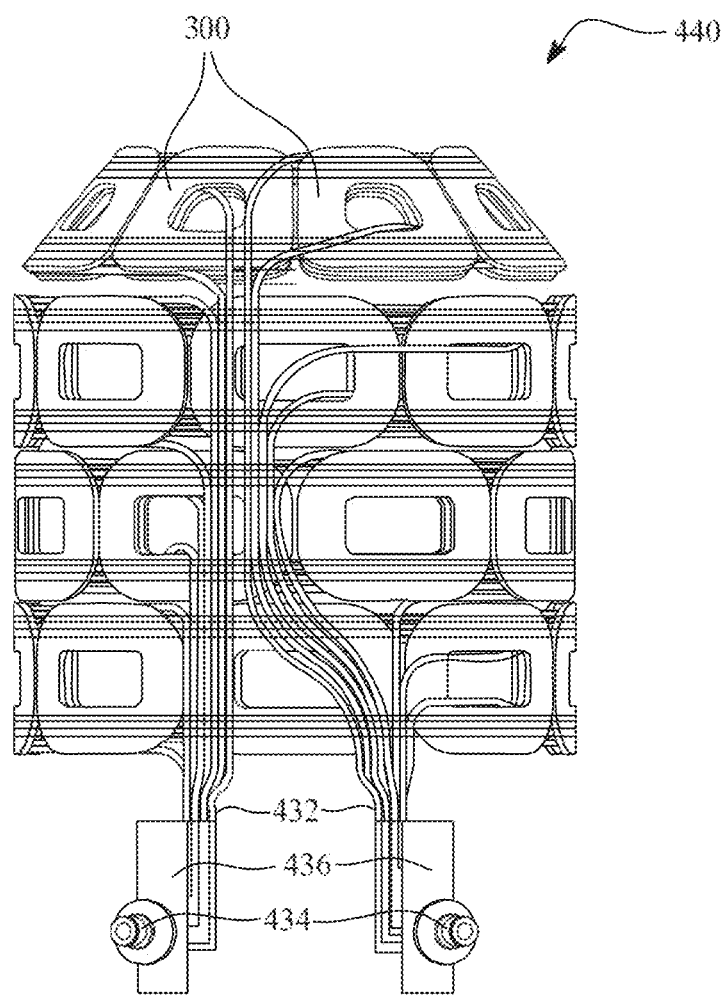
FIG. 4D is a block diagram that illustrates an example multi-coil (MC) subsystem showing routing of pipes serving as cooling tubes, according to an embodiment.
Figure 4E:
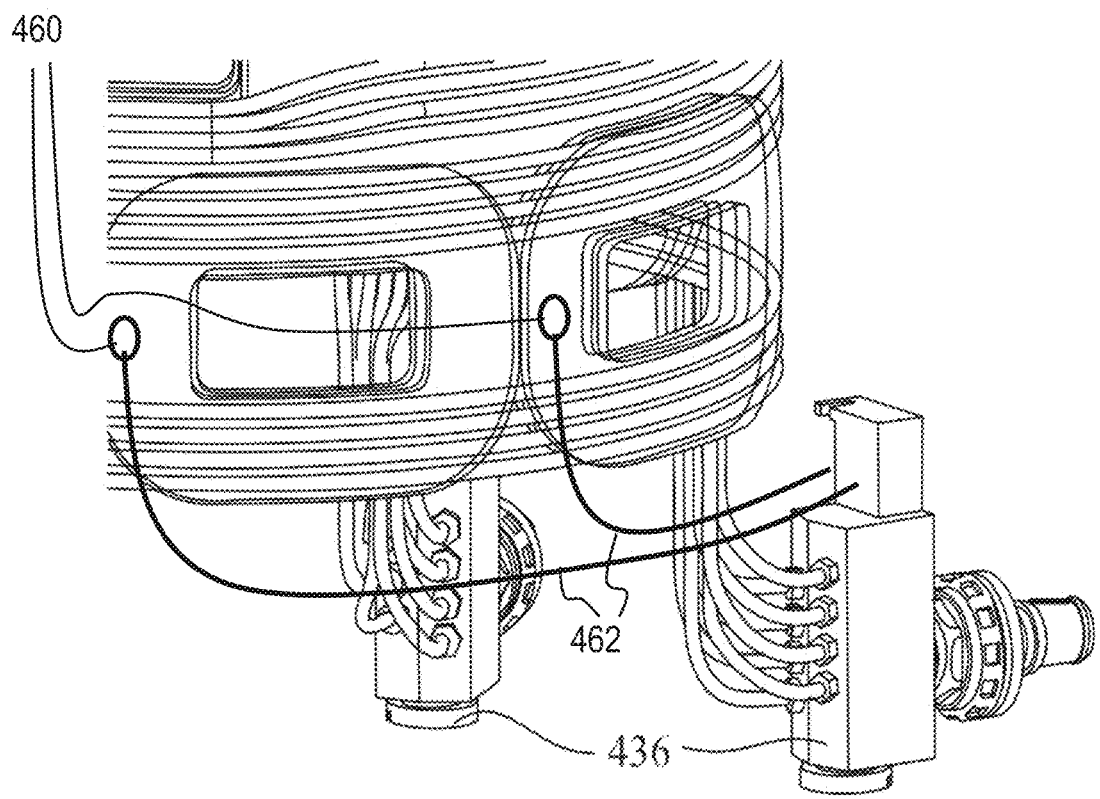
FIG. 4E is a drawing that illustrates an example rear view of two manifolds, according to an embodiment.

FIG. 4D is a block diagram that illustrates an example system 330 of multiple coil units 300 showing routing of 8 pipes 432 serving as cooling tubes 306, according to an embodiment. Each coil unit 300 is cooled by 2 such pipes, one for the upper half and one for the lower half of each coil unit 300. In the illustrated embodiment, each end of multiple pipes 432 terminates in a single coolant supply fixture or sink fixture, collectively called coolant fixtures 434 through one or more manifolds 436. FIG. 4E is a drawing that illustrates an example rear view of two manifolds 436, according to an embodiment. The fixtures are advantageously connected to a one or more computer-controlled pumps 450 and coolant supply reservoir 452. To monitor the temperature within the system, temperature sensors 460 and their feed wires 462 are distributed over the setup of multiple coil units in various embodiments.

Figure 4F:
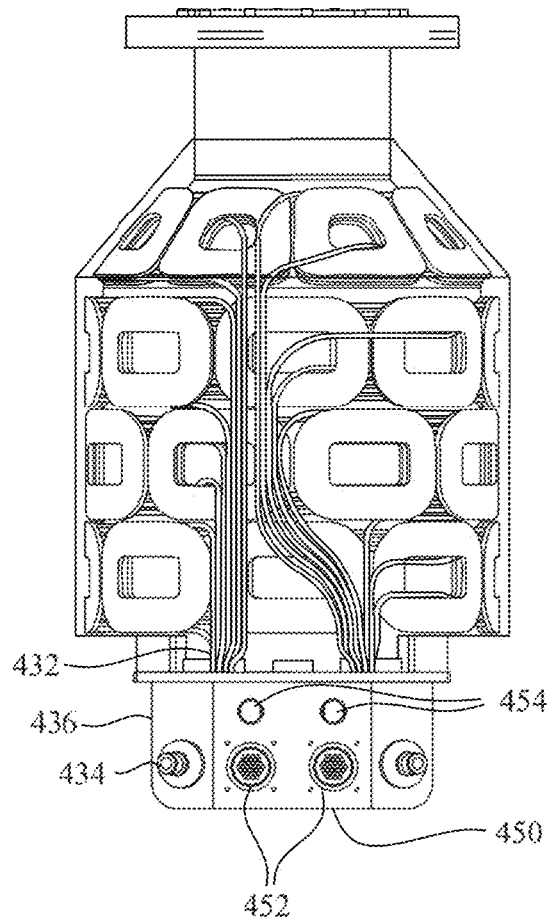
FIG. 4F is a drawing that illustrates an example electrical panel for terminating the leads from each coil unit and the temperature sensors, if any, according to an embodiment.

FIG. 4F is a drawing that illustrates an example electrical panel 450 for terminating the leads from each coil unit and the temperature sensors, if any, according to an embodiment. Connectors 452 have pin receptacles, one receptacle in each connector for one of two opposite leads to each coil unit in some embodiments; and both receptacles in one connector in other embodiments. There are benefits in wiring both leads for one coil into the same connector: This way a cable or connector failure would result in some coils being inactive instead of all of them, and it might potentially be beneficial to have a coil system that can be used with just a subset of coils (e.g. because there are not enough amplifier channels at a specific location to drive all coils. Temperature sensors, if any are powered and return signals received through connectors 454 to wires 462.

Figure 5A:
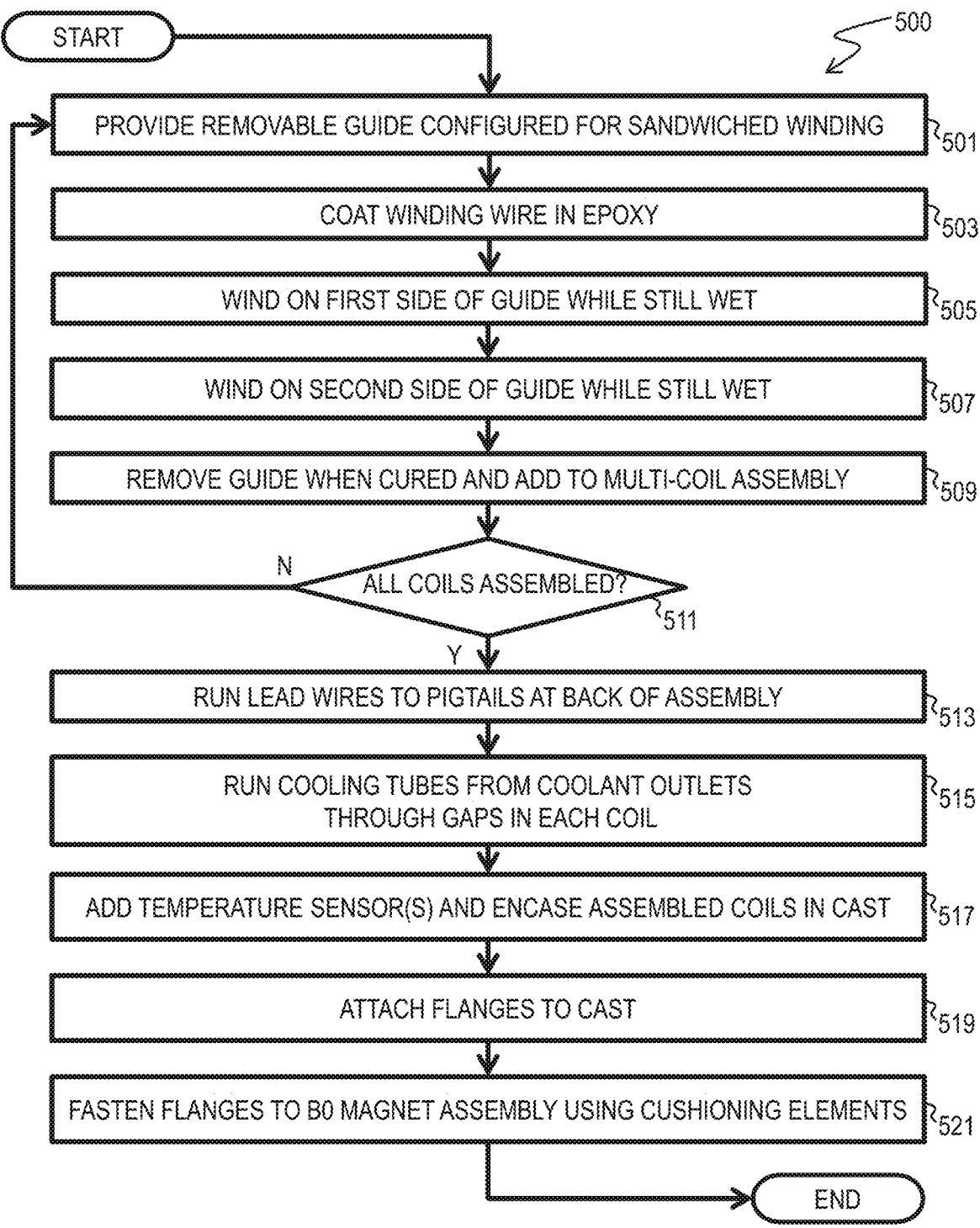
FIG. 5A is a flow chart that illustrates an example method for fabricating a multi-coil subsystem, according to an embodiment.

FIG. 5A is a flow chart that illustrates an example method 500 for fabricating a multi-coil subsystem, according to an embodiment. Although methods are depicted in FIG. 5A, and in subsequent FIG. 5B, as a series of integral steps for purposes of illustration, in other embodiments, one or more steps, or portions thereof, are executed in a different order, in series or parallel, or are omitted or additional steps are added, or the method is changed in some combination of ways.

In step 501, a removable guide is provided to support two or more sandwiched windings. The separate windings of the sandwich are displaced longitudinally along a central axis that goes through the center of each winding. The guide is also configured to longitudinally separate the two or more windings so that cooling tubes can be placed between each adjacent two windings.

In step 503, each wire, coated with electrically insulating material, to be used in the windings is further coated in epoxy to provide a matrix for holding the winding together. In step 505 the wire is wound on a first side of the guide while the epoxy on the wire is still wet. In step 507, the same or different wire is then wound on the second side of the guide while the epoxy on the wire is still wet. If separate wires are used on each winding, they are connected together in series, e.g., by soldering. The two ends of the wire are not wound to provide leads to the individual coil of the sandwiched windings.

In the illustrated embodiment, each winding has the same number of winds, with the same inner and outer diameter closest and farthest form the central axis and equal longitudinal thickness. In other embodiments, the number of winds, inner length and width or perimeter, outer length and width or perimeter or longitudinal thickness, or some combination, is different between the multiple windings forming a single sandwiched coil unit. The number of windings and insulated wire used in each winding is configured to provide a portion of the magnetic field for a particular magnetic resonance measurement system. Example dimensions and features of sandwiched winding for a STEREO head MR measurement system (Snyder et al, 2014), and thus the dimensions of the removable guide, are described in more detail below.

In some embodiments, steps 501 through 509 are replaced by the method 3700 of FIG. 3H using the system 3500 of FIG. 3C with bobbin 3694 of FIG. 3D.

In step 509, when the coil unit made of the two or more windings is cured, it is removed from the guide or bobbin and added to a form or scaffolding that is configured to hold multiple sandwiched coils in a multi-coil assembly to form a shell that at least partly encloses a MR measurement space, such a depicted in FIG. 4B. Steps 501 through 509 are, or method 3700 is, repeated until all coils for the multi-coil assembly have been assembled on a form to define a space into which a subject to be measured is to be placed. When it is determined in step 511 that all coils are in place, then control passes to step 513.

In step 513, the lead wires from each coil in the multi-coil assembly are run to one or more pigtails in one or more electrical panels at one more positions along the assembly. In step 515, cooling tubes are run from coolant fixtures at one or more positions along the assembly, near or separate from the pigtails, so that at least one cooling tube goes through the gap between each adjacent two windings in each coil unit. It is advantageous to run at least two cooling tubes through each gap, one each on opposite sides of the longitudinal axis through each winding to provide more even cooling.

In step 517, the assembly of coil units, including leads and cooling tubes, and any temperature sensors, is encased in a cast, such as a fiberglass cast to rigidly hold the assembly together. In some embodiments, the cast is formed inside an aluminum mold. In some embodiments, materials are included in the cast to help dissipate heat from the cooling tubes running through the cast. In step 519 flanges are attached to the cast, e.g., with glue or epoxy, or the flanges include additional protrusions that are incorporated in the cast during formation of the cast. The multi-coil assembly (shell), cast and, optionally, the flanges and temperature sensors, comprise the multi-coil subsystem.

Figure 5B:
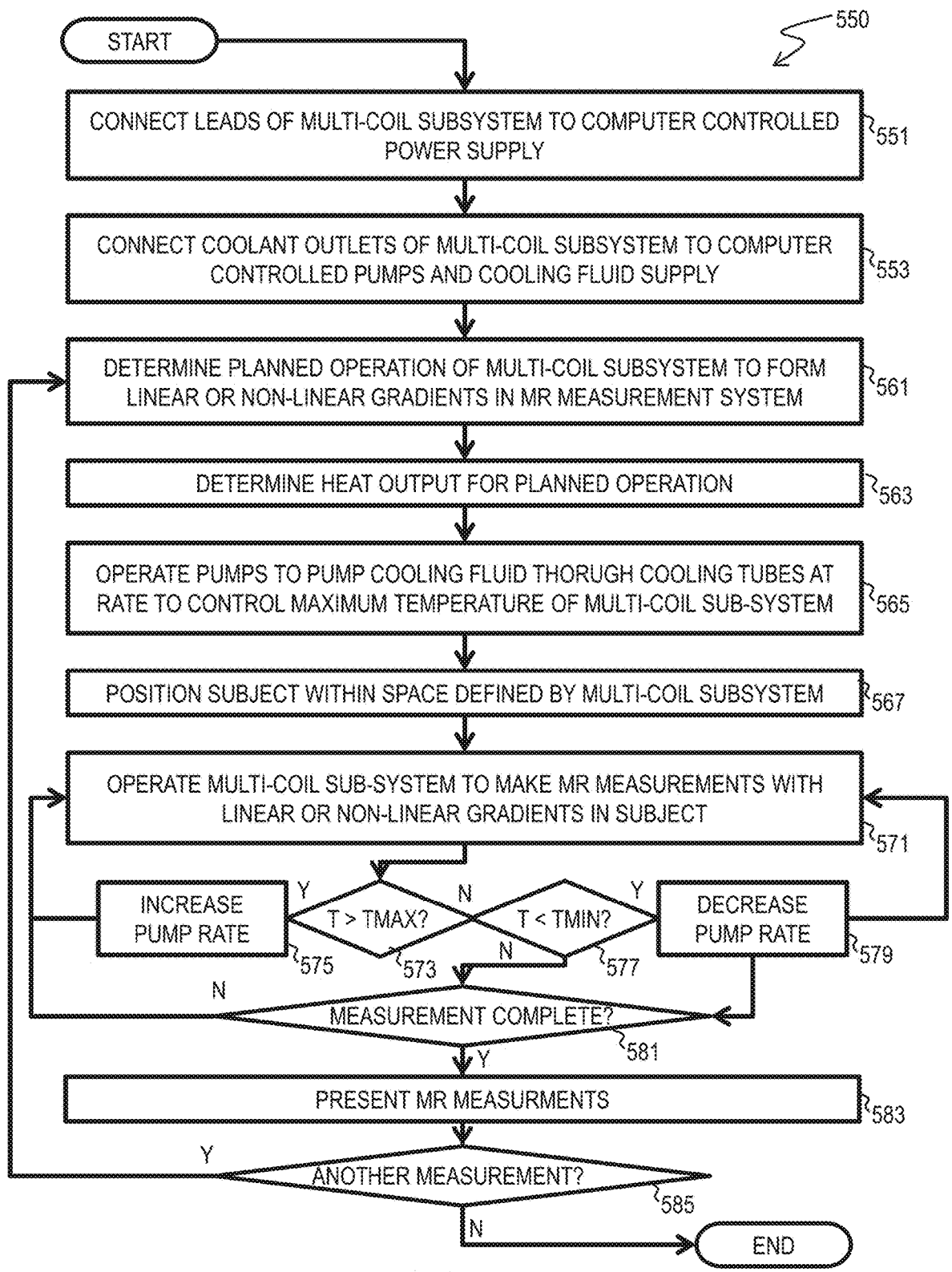
FIG. 5B is a flow chart that illustrates an example method for operating a multi-coil subsystem within a MR system, according to an embodiment.

In step 519, the multi-coil subsystem is attached to the MR measurement system using fasteners, such as bolts and washers, and cushioning elements, as depicted in FIG. 4C, to reduce the transfer of vibrations from the subsystem to the magnets of the MR measurement system, FIG. 5B is a flow chart that illustrates an example method 550 for operating a multi-coil subsystem within a MR measurement system, according to an embodiment. Some or all of the steps, or portions thereof, are performed by module 160 in computer controller 180 as depicted in FIG. 1 and FIG. 4A. In step 551, the electrical leads of the multi-coil subsystem are connected to a computer controlled electrical power supply 444. In step 553, the coolant fixtures are connected to a computer-controlled pump 450 and cooling fluid (coolant) supply 452, as depicted in FIG. 4A.

In step 561, the operation of each coil in the multi-coil subsystem is planned to form the linear or non-linear gradient or shim fields, or some combination, to support a particular MR measurement. Because of the number of coils in the multi-coil subsystem, and individual operation of each, a wide variety of MR measurement types can be performed. In step 563, the heat output by each coil in the multi-coil subsystem to perform the planned operation is determined, e.g., using measurement or computer modeling or some combination. In either step 563 or 565, the rate of coolant fluid flow through cooling tubes is also computed in order to prevent excessive heat buildup and thus keep the operation temperature within a desired range between a minimum desired operating temperature Tmin (if any) and a maximum desired operating temperature Tmax. In step 565, the computer-controlled pump or pumps are operated to pump the cooling fluid through the cooling tubes at a rate to control the temperature of the multi-coil subsystem.

In step 567, a subject is positioned with the space defined by the multi-coil subsystem. For example, a head or hand or foot of a subject, or a manufactured part, is placed in the space at least partly enclosed by the multi-coil subsystem. In step 571, the multi-coil subsystem is operated to make the MR measurements in the subject, by inducing linear or non-linear gradient or shim magnetic fields.

In some embodiments, there is a temperature feedback loop to ensure the temperature of the multi-coil subsystem does not move outside the desirable temperature range. This feedback is accomplished by steps 573 through 579 and involves use of one or more temperature sensors 460 embedded in the multi-coil subsystem. In step 573, it is determined if the temperature exceeds or is quickly rising toward Tmax. If so, control passes to step 575 to increase the pump rate to push cooling fluid through the cooling tubes more rapidly. In some embodiments, the system is simply shut off in step 575. Control then passes back to step 571 to operate the multi-coil subsystem in the context of the MR measurement. If temperature does not exceed and is not quickly rising toward Tmax, then control passes to step 577. In step 577, it is determined whether the temperature is below or quickly falling toward Tmin, if any. If so, then control passes to step 579 to decrease the pump rate and then to step 571 to continue the operation of the multi-coil subsystem in the context of the MR measurement. If temperature is not below and not quickly falling toward Tmin, or if step 577 is omitted, control passes to step 581.

In step 581, it is determined whether the MR measurement is complete. If not, control passes back to step 571 to operate the multi-coil subsystem in the context of the MR measurement. Otherwise, control passes to step 583 to present the MR measurement, by displaying a value or image on a display or sending data to another application through an application programming interface (API) or network message, or to operate another piece of equipment, such as a surgical device, based on the MR measurement result.

Control then passes to step 585 to determine whether there is another measurement to be made. If not, the process ends. Otherwise, control passes back to step 561 and following to plan and execute the next measurement.

2. Example Embodiments

In an experimental embodiment, each coil unit includes two windings that each includes 100 loops roughly rectangular in shape in a plane perpendicular to the longitudinal axis with an outer edge that is about 9 centimeters wide and about 14 centimeters long and an inner edge that is about 4 centimeters wide and 9 centimeters long. For example, in one embodiment, the sandwich elements are 4 mm thick (radial direction), 88 mm high (z-direction) and cover 45 degrees, which translates to 123 mm width. The entire coil (two sandwich elements with gap) is 12 mm thick. In other embodiments, the coil units can reasonably span about 50 mm to about 150 mm in the z-direction; and about 2 mm to about 8 mm radially for each element. They could cover anything from 22.5 degrees to 90 degrees (e.g., about 4 to about 16 coils per ring).

2.2 Example Fabrication of Coil Unit

In an experimental embodiment, the coil winding tool consists of a rotary table 3810, a swinging arm 3824 to guide the wire and a wire tensioner 3830 as shown in FIG. 3F. The rotary table 3810 holds an aluminum mold bobbin 3890 which acts in some ways as an ordinary bobbin in common winding machines and otherwise defines the final non-planar shape of the coil. The tabletop sits on a turntable and is rotated by a stepper motor 3812 via a vertical and a horizontal shaft that is connected with a worm gear with a ratio of 1:20. The swinging arm 3824 is used to change the vertical position of the wire guide 3825 while the tabletop with the aluminum mold is rotating. This ensures accurate winding of the wire loops without scratching of the wire at the edges of the mold which could damage the insulating coating of the wire. The arm 3824 is fixed on a shaft and its position is controlled by a second stepper motor 3826 via a gearbox 3822 with a ratio of 1:9.

The motion of the rotary table and the arm are synchronized to accurately guide the wire during the winding process. Both motions are controlled by the same microcontroller (Arduino Due) with individual stepper motor drivers (GeckoDrive G2O3V). For the synchronization, the necessary angles of the arm vs. the angular position of the rotary table are measured or computed once, e.g., as plotted in FIG. 3G. This data is then converted to a text file storing steps of the arm controlling motor dependent on steps for the rotary table. Using this approach, the stored data is independent of the winding speed that can, therefore, be adjusted and varied over the winding process. The design additionally includes an LCD display printing out basic information during the winding process and a push-button to start and stop the process.

Tension control plays a role to achieve a high fill factor in coil winding. Too little tension or a loss thereof during the winding process will lead to loose wire loops, while too much tension will stretch the copper wire. The latter reduces the wires' cross section and increases its electrical resistance, as well as potentially breaking the wire. Since the coils being wound are of irregular shape, the wire length in the system varies during the winding process, increasing and decreasing the tension during the winding of one full loop. The wire tension, therefore, is advantageously controlled dynamically. For this purpose, a graduated mechanical tensioner was added (TC2L, ACME Mechatronics, Inc. TX, USA) that provides adjustable wire tension dynamically from 10 Newtons (N) to 50 N for wire diameters of 0.5 millimeters (mm) to 1.2 mm. The coils for the experimental embodiment utilize AWG 20 wire (0.9 mm diameter, recommended wire tension 35 N), however, the design is generally applicable and not limited to this wire type.

To automatically wet the magnet wire with the epoxy resin during the winding, a small epoxy feed tank was designed to be attached on the rotary arm.

The aluminum mold bobbin 3890 was designed in SolidWorks (Dassault Systèmes, Vélizy-Villacoublay, France) and machined by CNC milling to define the shape of the coil to be produced. The swinging arm 3824 rotates up and down to guide the vertical position of the wire synchronized with the rotation of the mold, ensuring accurate winding and preventing scratching of the wire on the edges. The effective length of the arm has been designed to be adjustable using a sliding member 3825 to be able to adapt to different mold sizes. Both the rotary table and the swinging arm are driven by stepper motors that are controlled by a single microcontroller (Arduino Due) via individual step drivers (G203V, Geckodrive Inc., Santa Ana, CA, USA).

The microcontroller was programmed so that the mold is rotating at a constant speed. The optimal angle of the arm as a function of table position was measured and converted to text files specifying the necessary motor steps using a python script and read by the microcontroller from an SD card at the start of the winding process. The optimal angle of the arm depends on the number of turns already wound onto the mold and the synchronization has to be updated throughout the winding process of the coil to account for it.

An example curved coil element (length 115 mm, height 73 mm, width 4 mm, radius 16 cm) with 100 turns of copper wire was produced. Tension control ensures tight wire packing. However, wire crossing could not be fully avoided in the initial experiments, which yields a fill factor of 68%. Thus the maximum fill factor of 90.7% for orthocyclic winding is not achieved.

Synchronization of the swinging arm 3824 and the rotary table 3810 in this prototype is based on manual measurements of arm and angle positions, respectively. In other embodiments, the calculation of optimum angles is determined directly from the established CAD model of the device, thereby simplifying the adaptation to specific coil geometries. In addition, in some embodiments, a feedback mechanism of the motor control will be included for refined synchronization accuracy of the stepper motors throughout the winding process. A comprehensive configuration of the employed microcontrollers driving the two motors 3812 and 3822 based on real-time position measurements is furthermore expected to enable elevated winding speed and increased productivity.

2.3 Example MR System of Coil Units

Based on a proof-of-principle implementation of a 28-channel multi-coil (MC) system developed earlier, and described in more detail below with reference to FIG. 6A through FIG. 6E, a 31-channel MC system has been designed for producing spatial-encoding fields including a parabolic focus spiraling throughout the field-of-view for STEREO MRI. The MC design procedure employed Biot-Savart simulations and MC methods in line with numerous successful MC implementations in the past. In short, the MC system geometry includes 4 rings of 8 rectangular non-planar coils at 200 turns per coil describing a circular shape (FIG. 4B). Two coils of the second row in front of the subjects' eyes have been merged as elongated coil 441 to allow unobstructed visual access, thereby resulting in an effective 31 coil elements. The uppermost row is tilted 40° inwards to accommodate the conical magnet design. The electrical connections are made with stranded AWG 16 twisted pair.

The subsystem heat generation can be calculated based on the following as an example. One coil unit on the cylindrical surface (200 turns including lead wires) has a resistance of approximately 2 ohms ($\Omega$), an inductance of about 3.6 milliHenry (mH, 1 mH=$10^{-3}$ Henry, H, 1 H=1 kilogram meter squared per square second per square ampere) and is designed to be used with 5 amperes (A, 1 A=1 Coulomb per second) maximum current. In this example embodiment, water cooling of the coils is realized by guiding a total of 8 plastic pipes serving as cooling tubes through the gaps of the sandwich coils, as depicted in FIG. 4D, described above. Based on thermal simulations including flow dynamics of the coolant, it is expected that the maximum temperature in the copper will not exceed 50° C. To monitor the temperature within the system 440, twelve PT100 resistance temperature detectors (RTDs) are distributed over the multi-coil subsystem. They are connected with 3 AWG 26 lead wires each.

The entire subsystem 440, including lead wires and cooling pipes, is cast in epoxy resin filled with woven glass fiber fabric in an aluminum mold for rigidity. Wires and cooling pipes are guided to the lower back of the unit and exit the fiber glass volume as so-called pigtails, as described above with reference to FIG. 4B. In some embodiments, a short distance pigtail of wires is used to pin connectors at a panel. Strain relief for wires at epoxy boundary is provided using silicone The multi-coil subsystem 440 is equipped with two G10 fiberglass flanges at the bottom and one aluminum flange at the top for mounting to the superconducting $B_0$ magnet assembly 410. The bottom flanges are glued to the cast volume by epoxy resin, while the top flange is connected to the fiberglass volume via a premanufactured fiberglass tube. There are 4 through-holes for four M6 bolts in the top flange and two or three holes for M10 bolts in each of the bottom front and bottom back flanges (448 in FIG. 4B). The bolts are M10, 35 mm to 45 mm long, (mainly depending on the dimensions of the cushion elements). In various embodiments, M8 through M12 with the same length would also be reasonable. Mounting points for a field camera rig are also used. A non-optical $B_0$ field measurement device, called a field camera, is mounted at the top and bottom flanges via supplied threads. The field camera is used to measure the magnetic field for calibration of the multi coil setup and B0 mapping prior to the setup being used on human subjects. This 'field camera' can measure B0 fields at a set (or matrix) of well-defined points in space.

All cooling pipes and electrical connection wires are guided through cutouts in the bottom back flange to a plastic panel equipped with commercially available connectors. The wires can be connected to these connectors in any manner, such as via crimp and solder contacts. The cooling pipes can be connected in any manner, such as by being connected to ½" non-spill connectors as fixtures via manifolds. In some embodiments, the cooling pipes are made up of 4 mm outside diameter, 2.9 mm inside diameter polyethylene tubes. In some embodiments, a custom manifold (see item 436 in FIG. 4E) connects parallel pipes to single inlet/outlet fixture.

A bottom electrical panel (see item 450 in FIG. 4F) is mounted to the flange, e.g., via M3 bolts. For that embodiment, threaded brass inserts are cast into the flange.

Figure 6A:
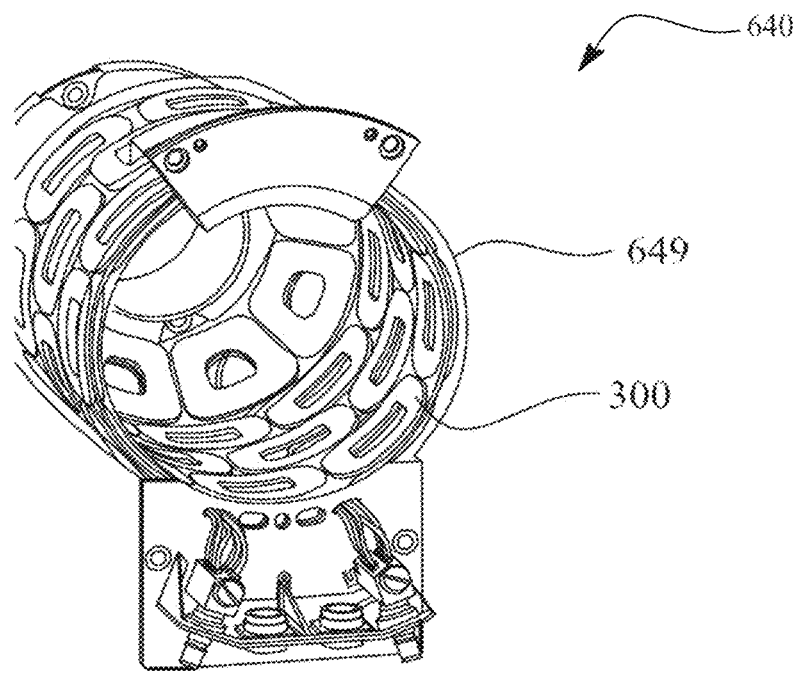
FIG. 6A is a diagram that illustrates an example multi-coil subsystem, according to an experimental embodiment.
Figure 6B:
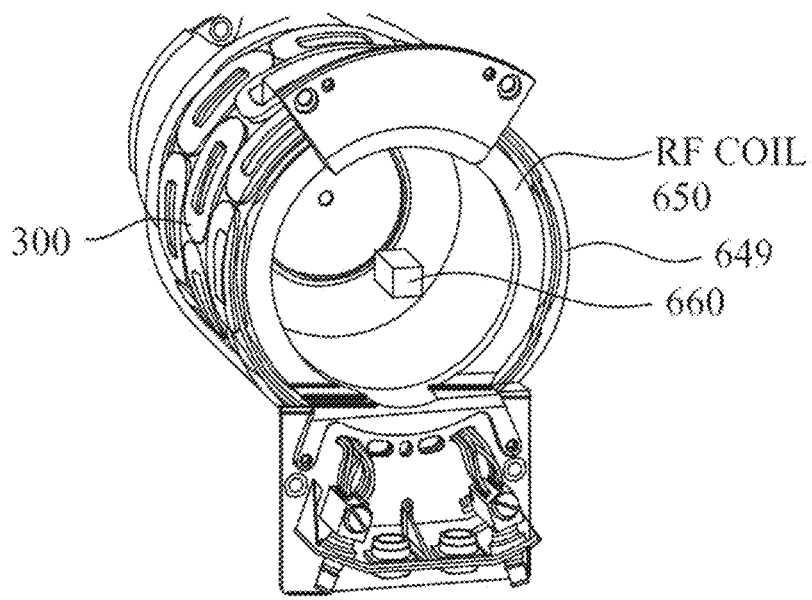
FIG. 6B is a diagram that illustrates an example volume element sampled within the multi-coil subsystem, according to the experimental embodiment.

FIG. 6A is a diagram that illustrates an example multi-coil subsystem 640, according to an experimental embodiment. This embodiment includes 31 coil units 300, arranged in four circular rows of eight coils each (with two coil units merged into a window) to at least partially enclose a cylindrical space. In previous embodiments, the coils were held together in a nylon former serving as cast 649. FIG. 6B is a diagram that illustrates an example volume element 660 sampled within the space at least partially enclosed by the multi-coil subsystem, according to the experimental embodiment. Inside the cast 649 and coil units 300 is a white radio frequency (RF) coil 650.

Figure 6C:
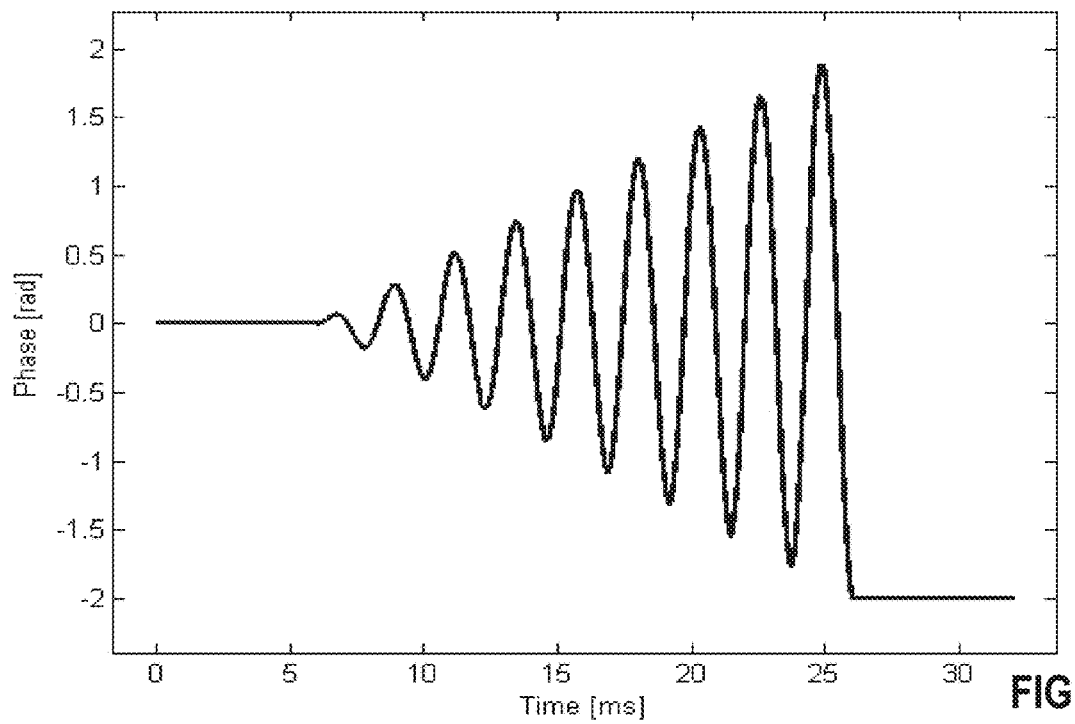
FIG. 6C is a graph that illustrates an example simulated temporal return from a volume element sampled within the multi-coil subsystem, according to the experimental embodiment.
Figure 6D:
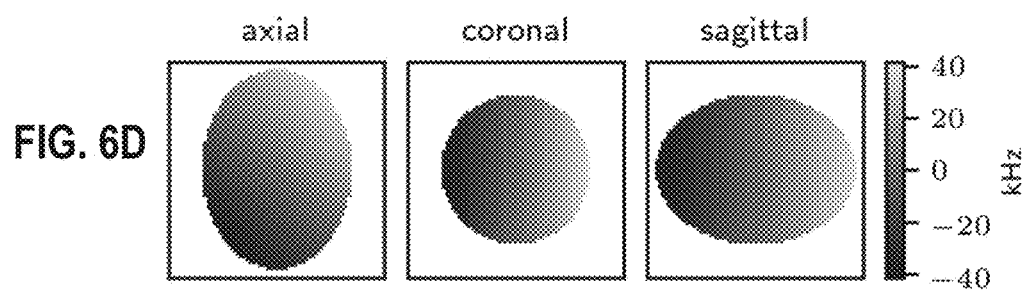
FIG. 6D shows a simulation result of an oblique linear gradient field created with this setup, according to the experimental embodiment.
Figure 6E:
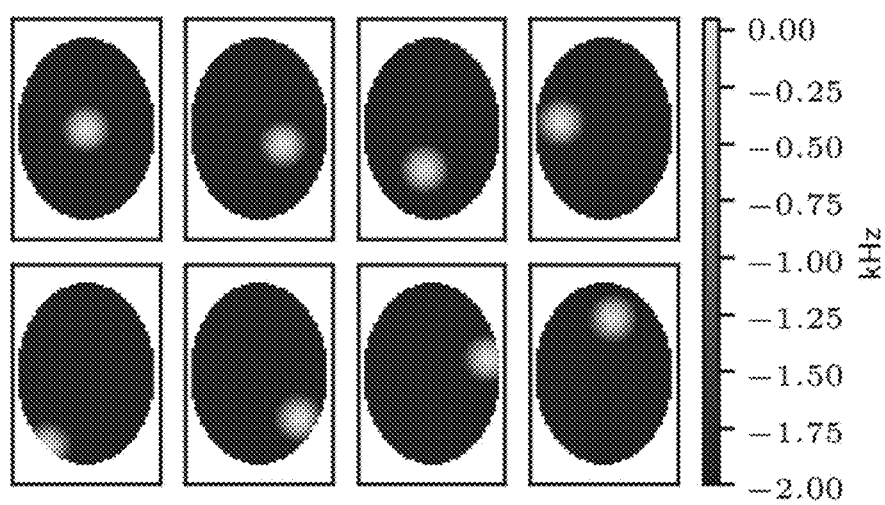
FIG. 6E is a graph that illustrates an example simulated spiral sequence of focused volumes during sampling with the multi-coil subsystem, according to the experimental embodiment.

FIG. 6C is a graph that illustrates an example simulated temporal return from a volume element sampled within the multi-coil subsystem, according to the experimental embodiment. The horizontal axis indicates time in milliseconds and the vertical axis indicate phase in radians. Spectral content and relaxation times for the volume element can be determined from this time trace. FIG. 6D shows a simulation result of an oblique linear gradient field created with this setup, according to the experimental embodiment. FIG. 6E is graph that illustrates an example spiral sequence of focused volumes during sampling with the multi-coil subsystem, according to the experimental embodiment. FIG. 6E shows non-linear parabolic fields at different locations as desired for STEREO.

This embodiment demonstrated the feasibility of converting generic, localized DC coils to form a powerful field modeling system, and the benefits of the dynamic multi-coil (MC) technique for $B_0$ homogenization and MRI. The multi-coil (MC) loop arrays of this MRI system provide the spatially-dependent $B_0$ for spatiotemporal excitation and encoding of signals, while significantly reducing bulk and electrical power requirements as compared with the expensive, massive, and high power gradient systems used in commercial MRI scanners. The MC array allows dynamic control of the shape of $B_0$ to optimally steer resonance over the brain and to provide optimal spatial-encoding field profiles for "steering the resonance over the object" (STEREO) and "magnetization-prepared steady-state free precession" (MP-SSFP) MRI. The MC array replaces the gradient coils of the traditional MRI scanner. As compared with standard gradient coils, water-cooled MC arrays occupy much less magnet bore space and do not require high-power amplifiers.

Figure 7A:
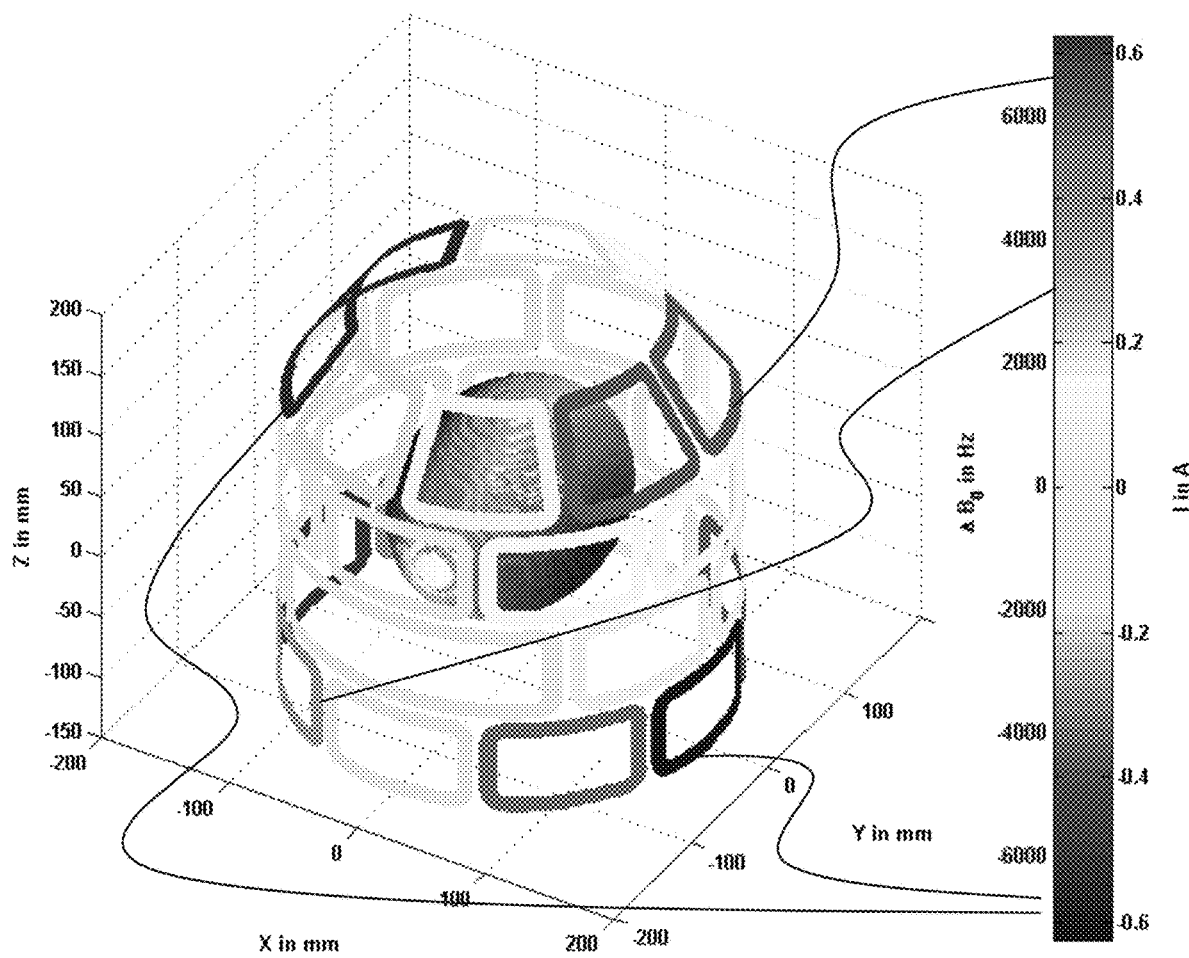
FIG. 7A is a plot that illustrates an example simulated magnetic gradient in a sample volume and corresponding currents in a multi-coil subsystem, according to an experimental embodiment.

Magnetic field gradient per unit current of individual coils are mapped via Biot-Savart simulations using customized B0DETOX software (written for MATLAB™, MathWorks, Natick, Massachusetts). A desired target field is created based on problem at hand (e.g. shimming, Z-gradient). Optimal coil currents are identified by minimizing deviation between target field and sum of scaled individual coil fields. FIG. 7A is a plot that illustrates an example simulated magnetic gradient in a sample volume and corresponding currents in a multi-coil subsystem, according to an experimental embodiment. The generation of a 1 kHz× gradient field was simulated in an ellipsoidal region of interest within the space at least partially enclosed by the MC subsystem. The gradient field is displayed on the surface of the ROI, while the grayscale of the individual coils visualizes the current in the coil.

Figure 7B:
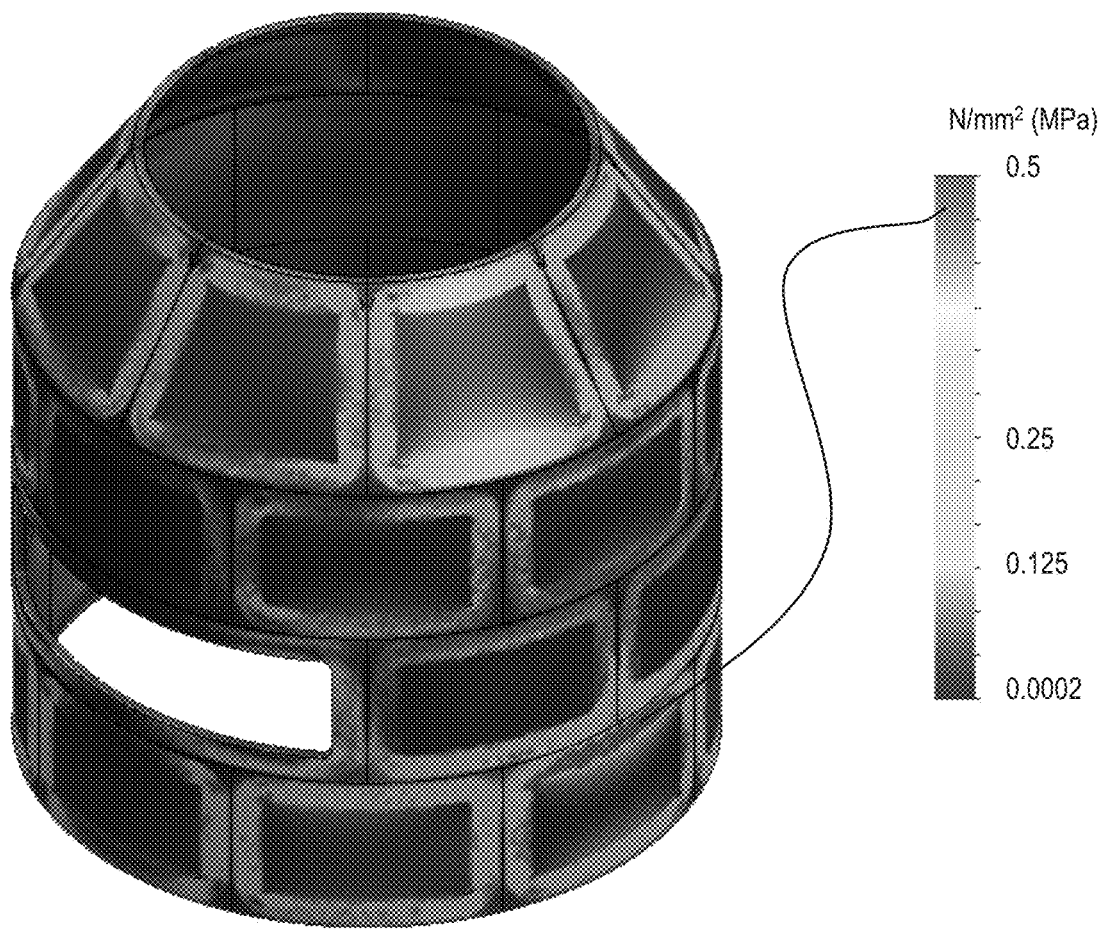
FIG. 7B and FIG. 7C are plots that illustrate example simulated vibrational forces in a multi-coil subsystem, according to an experimental embodiment.
Figure 7C:
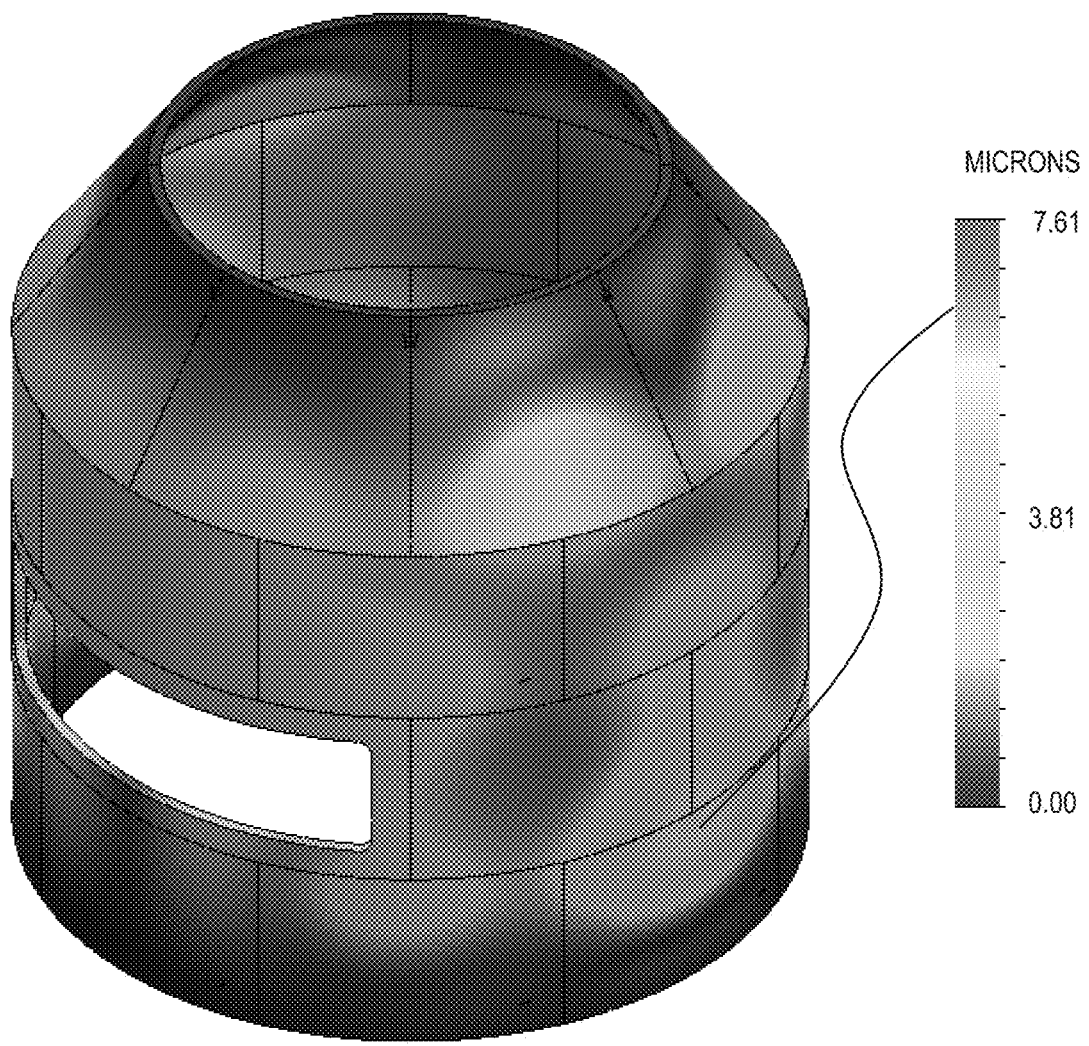

FIG. 7B and FIG. 7C are plots that illustrate example simulated vibrational forces in a multi-coil subsystem, according to an experimental embodiment. The Lorentz forces acting on the coils in a 1.5 T B field due to the individual currents calculated in MATLAB were used as input for a mechanical simulation of the mechanical stresses (FIG. 7B) and resulting displacements (FIG. 7C) of the mounting structure of the MC subsystem. As expected, the load on the geometry is non-uniformly distributed, which is a direct result of the different currents of the individual coils.

As a further assessment of these Lorentz caused vibration effects, a finite element analysis (FEA) was performed of the expected vibration modes of the MC hardware as part of the novel 1.5 T head-only MR system. All analyses were performed in Solidworks (Dassault Systèmes, Vélizy-Villacoublay, France). The CAD model of the MC array (FIG. 4B) was reduced to relevant structural components to create a suitable FEA model. A modal analysis was implemented by applying sinusoidal harmonic excitations as torques acting on the MC array's coil elements and simulating the displacement fields for different excitation frequencies. The torques of up to 5.1 Nm were applied based on precalculated coil currents corresponding to the generation of typical MC fields to be employed for imaging the human head. All material behavior was assumed isotropic linear elastic and material parameters were assigned using Solidworks' database values. The mounting points (5 at the bottom, 4 at the top) were modeled as fixed restrains without pre-stressing.

The exact material properties of the in-house created fiberglass reinforced epoxy (GRE) are unknown. Therefore, the analysis was performed twice with common values for a softer and a stiffer material (Young's moduli 23 GPa and 40 GPa, respectively).

Besides rigid mounting of the MC array to the MR scanner structure, potential and characteristics of mechanical decoupling were analyzed. To this end, in a third analysis, the latter analysis was repeated while introducing rubber elements at the fixture points to introduce vibrational damping of the structure.

Figure 7D:
FIG. 7D and FIG. 7E are maps that illustrate example displacement fields during harmonic excitation at excitation frequencies of 750 Hertz (Hz) and 1000 Hz, respectively, according to an embodiment.
Figure 7E:
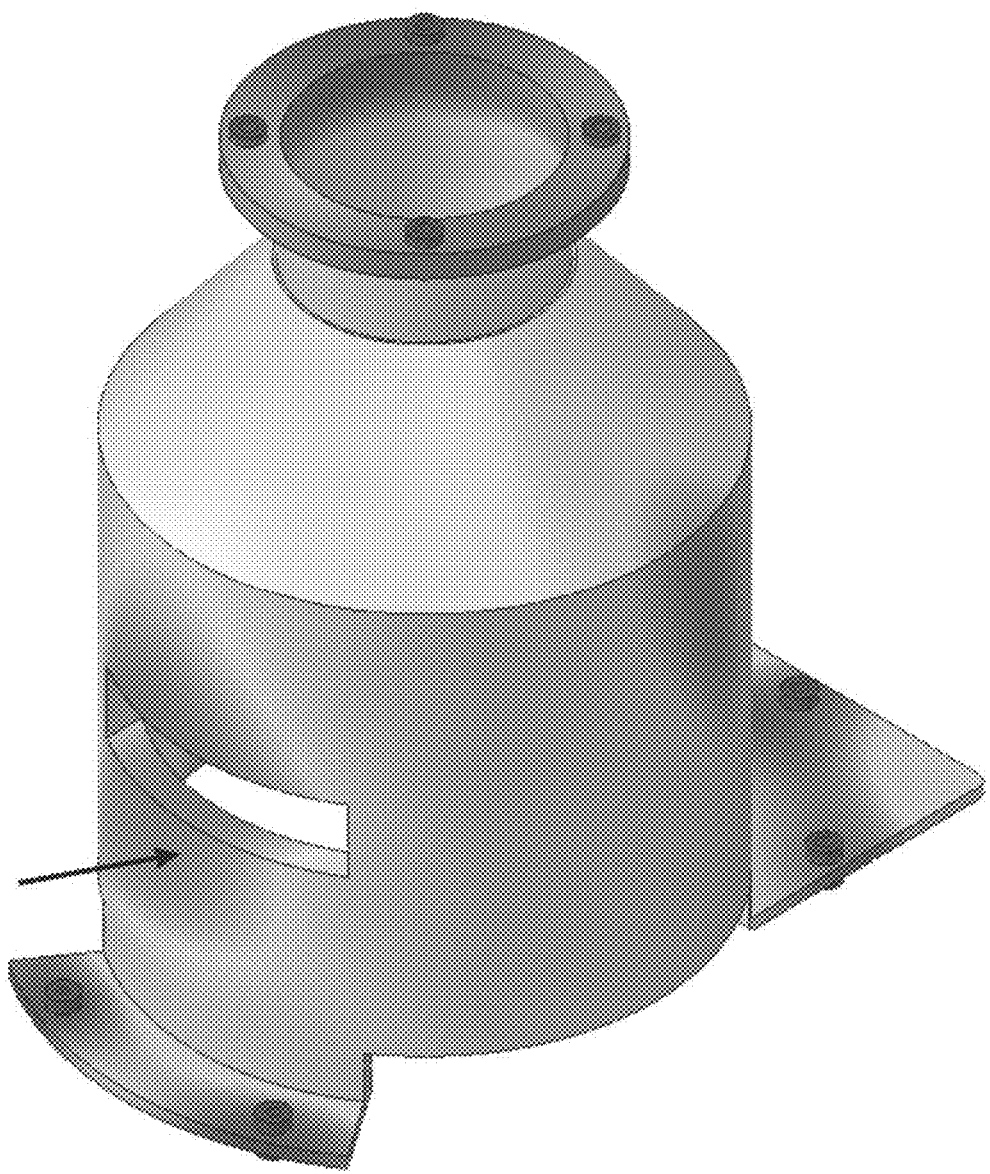

FIG. 7D and FIG. 7E are maps that illustrate example displacement fields during harmonic excitation at excitation frequencies of 750 Hertz (Hz) and 1000 Hz, respectively, according to an embodiment. Shown is the absolute displacement. The area below the window (arrow) was found to represent the vibrational behavior of the system best and was subsequently used to create amplification functions in FIG. 7F and FIG. 7G. Amplification functions are determined by plotting the average displacements of nodes in that area as a function of the excitation frequency f.

Figure 7F:
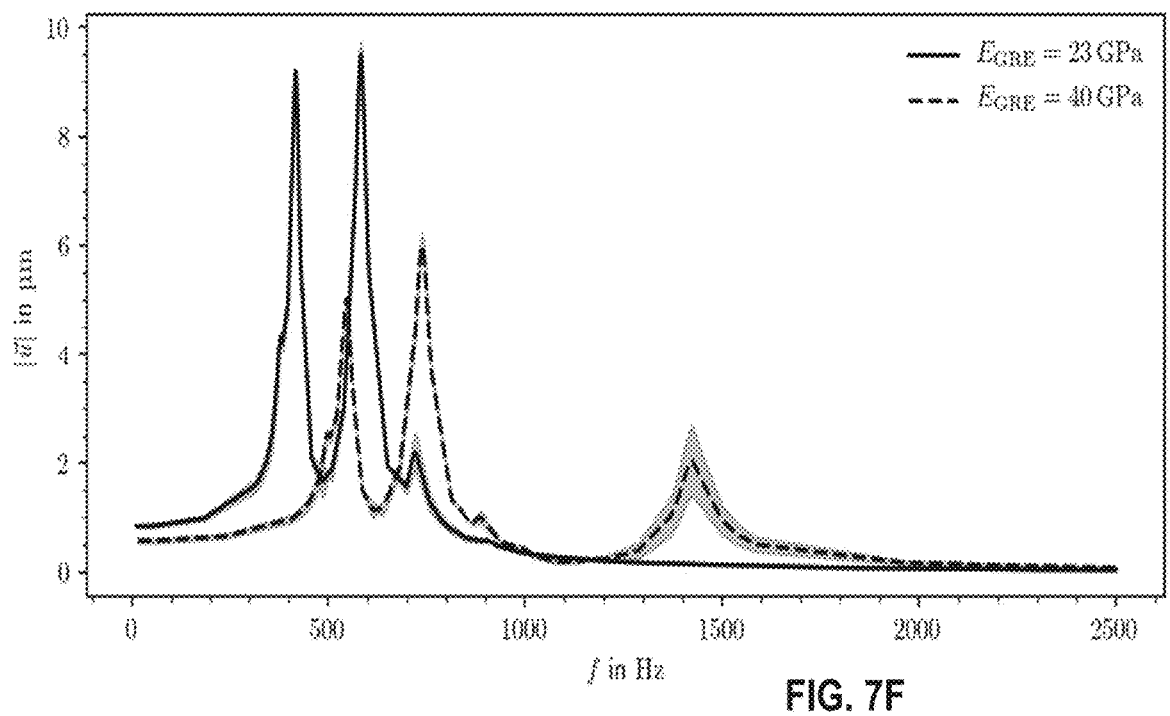
FIG. 7F is a plot that illustrates an example amplification function of the MC system with fixed restrains, according to an embodiment.

FIG. 7F is a plot that illustrates an example amplification function of the MC system with fixed restrains, according to an embodiment. Shown is the average absolute displacement of nodes in the area below the window opening. The analysis was performed with a lower and a higher value for the Young's modulus of the GRE. Two significant resonances can be identified at 417 Hz and 582 Hz that are shifted to higher frequencies with the stiffer material. There, a third resonance at 1424 Hz is visible as well.

Figure 7G:
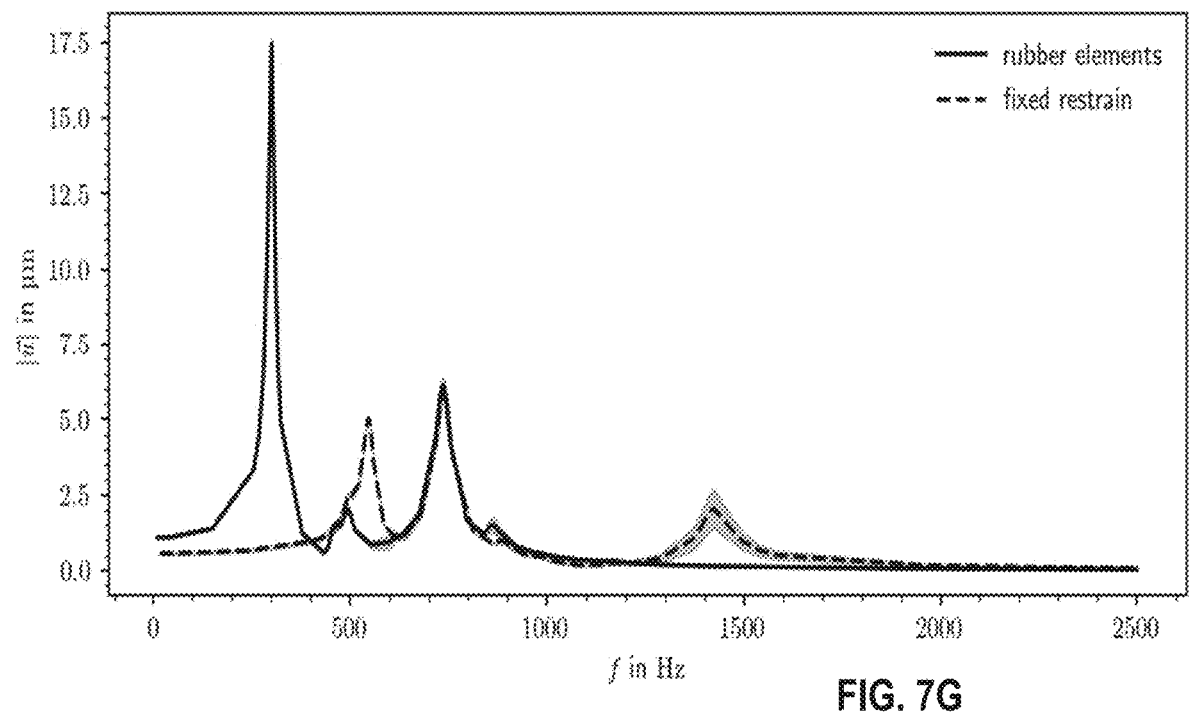
FIG. 7G is a plot that illustrates an example amplification function of the MC system with rubber mounting, according to an embodiment.

Adding the rubber elements to the mounting positions increased the degrees of freedom in the mechanical coupling between the MC array and the surrounding structure. FIG. 7G is a plot that illustrates an example amplification function of the MC system with rubber mounting, according to an embodiment. This simulation was performed using the higher stiffness for the GRE material. The results for the corresponding rigid fixture points are plotted for comparison. While frequencies above 1000 Hz appear to be dampened through introduction of the rubber elements, lower frequencies appear to be amplified with the appearance of a large and narrow resonance at 300 Hz. The resonance at 738 Hz appears unchanged.

Figure 7H:
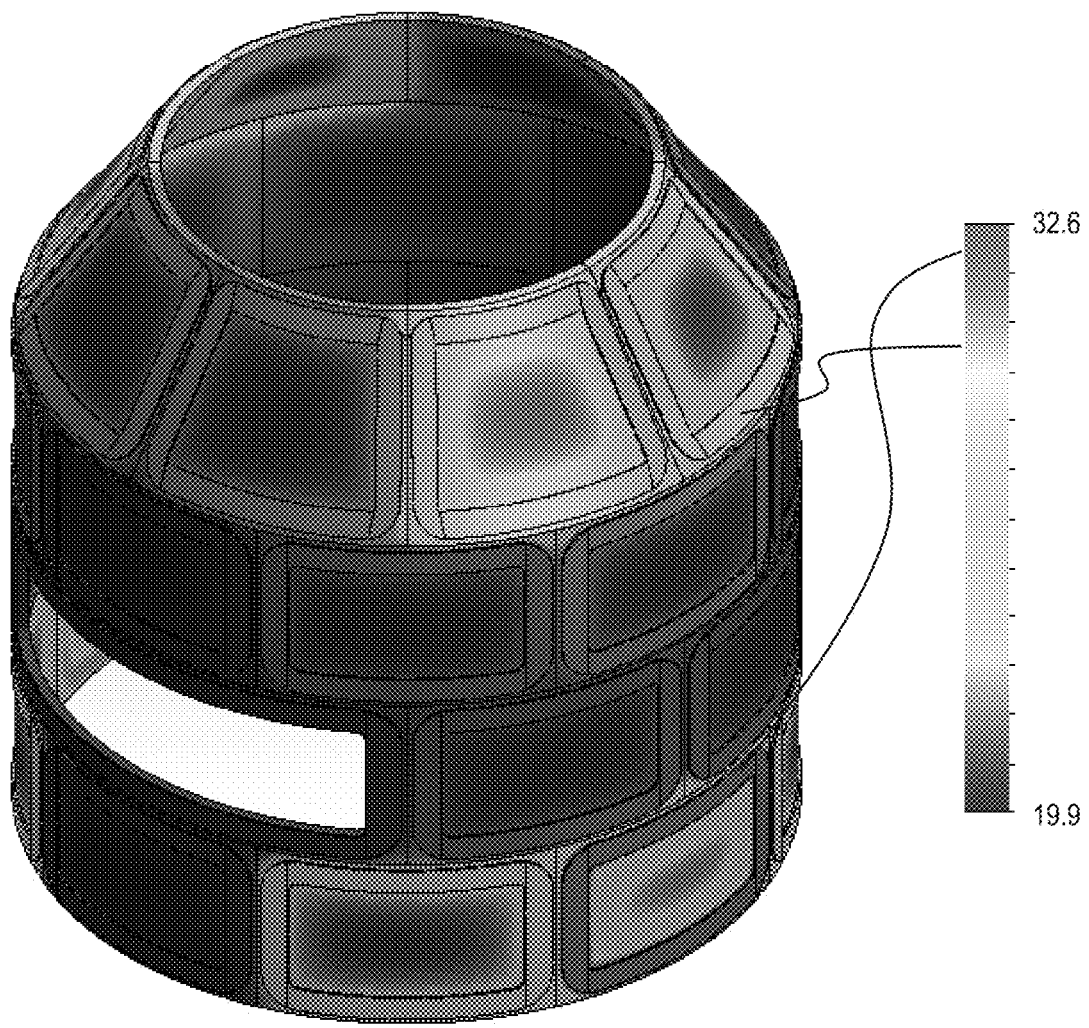
FIG. 7H is a plot that illustrates an example simulated temperature distribution in a multi-coil subsystem, according to an experimental embodiment.

FIG. 7H is a plot that illustrates an example simulated temperature distribution in a multi-coil subsystem, according to an experimental embodiment. The thermal simulation shows the temperature in the MC setup during the generation of the X gradient as simulated assuming convectional cooling. This temperature is mitigated by use of the cooling coils.

Further details of various experimental and simulated embodiments are included in the appendices. The statements made in any appendix apply only to the embodiments described in that appendix.

3. COMPUTATIONAL HARDWARE OVERVIEW

FIG. 8 is a block diagram that illustrates a computer system 800 upon which an embodiment of the invention may be implemented. Computer system 800 includes a communication mechanism such as a bus 810 for passing information between other internal and external components of the computer system 800. Information is represented as physical signals of a measurable phenomenon, typically electric voltages, but including, in other embodiments, such phenomena as magnetic, electromagnetic, pressure, chemical, molecular atomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range. Computer system 800, or a portion thereof, constitutes a means for performing one or more steps of one or more methods described herein.

A sequence of binary digits constitutes digital data that is used to represent a number or code for a character. A bus 810 includes many parallel conductors of information so that information is transferred quickly among devices coupled to the bus 810. One or more processors 802 for processing information are coupled with the bus 810. A processor 802 performs a set of operations on information. The set of operations include bringing information in from the bus 810 and placing information on the bus 810. The set of operations also typically include comparing two or more units of information, shifting positions of units of information, and combining two or more units of information, such as by addition or multiplication. A sequence of operations to be executed by the processor 802 constitutes computer instructions.

Computer system 800 also includes a memory 804 coupled to bus 810. The memory 804, such as a random access memory (RAM) or other dynamic storage device, stores information including computer instructions. Dynamic memory allows information stored therein to be changed by the computer system 800. RAM allows a unit of information stored at a location called a memory address to be stored and retrieved independently of information at neighboring addresses. The memory 804 is also used by the processor 802 to store temporary values during execution of computer instructions. The computer system 800 also includes a read only memory (ROM) 806 or other static storage device coupled to the bus 810 for storing static information, including instructions, that is not changed by the computer system 800. Also coupled to bus 810 is a non-volatile (persistent) storage device 808, such as a magnetic disk or optical disk, for storing information, including instructions, that persists even when the computer system 800 is turned off or otherwise loses power.

Information, including instructions, is provided to the bus 810 for use by the processor from an external input device 812, such as a keyboard containing alphanumeric keys operated by a human user, or a sensor. A sensor detects conditions in its vicinity and transforms those detections into signals compatible with the signals used to represent information in computer system 800. Other external devices coupled to bus 810, used primarily for interacting with humans, include a display device 814, such as a cathode ray tube (CRT) or a liquid crystal display (LCD), for presenting images, and a pointing device 816, such as a mouse or a trackball or cursor direction keys, for controlling a position of a small cursor image presented on the display 814 and issuing commands associated with graphical elements presented on the display 814.

In the illustrated embodiment, special purpose hardware, such as an application specific integrated circuit (IC) 820, is coupled to bus 810. The special purpose hardware is configured to perform operations not performed by processor 802 quickly enough for special purposes. Examples of application specific ICs include graphics accelerator cards for generating images for display 814, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 800 also includes one or more instances of a communications interface 870 coupled to bus 810. Communication interface 870 provides a two-way communication coupling to a variety of external devices that operate with their own processors, such as printers, scanners and external disks. In general, the coupling is with a network link 878 that is connected to a local network 880 to which a variety of external devices with their own processors are connected. For example, communication interface 870 may be a parallel port or a serial port or a universal serial bus (USB) port on a personal computer. In some embodiments, communications interface 870 is an integrated services digital network (ISDN) card or a digital subscriber line (DSL) card or a telephone modem that provides an information communication connection to a corresponding type of telephone line. In some embodiments, a communication interface 870 is a cable modem that converts signals on bus 810 into signals for a communication connection over a coaxial cable or into optical signals for a communication connection over a fiber optic cable. As another example, communications interface 870 may be a local area network (LAN) card to provide a data communication connection to a compatible LAN, such as Ethernet. Wireless links may also be implemented. Carrier waves, such as acoustic waves and electromagnetic waves, including radio, optical and infrared waves travel through space without wires or cables. Signals include man-made variations in amplitude, frequency, phase, polarization or other physical properties of carrier waves. For wireless links, the communications interface 870 sends and receives electrical, acoustic or electromagnetic signals, including infrared and optical signals, that carry information streams, such as digital data.

The term computer-readable medium is used herein to refer to any medium that participates in providing information to processor 802, including instructions for execution. Such a medium may take many forms, including, but not limited to, non-volatile media, volatile media and transmission media. Non-volatile media include, for example, optical or magnetic disks, such as storage device 808. Volatile media include, for example, dynamic memory 804. Transmission media include, for example, coaxial cables, copper wire, fiber optic cables, and waves that travel through space without wires or cables, such as acoustic waves and electromagnetic waves, including radio, optical and infrared waves. The term computer-readable storage medium is used herein to refer to any medium that participates in providing information to processor 802, except for transmission media.

Common forms of computer-readable media include, for example, a floppy disk, a flexible disk, a hard disk, a magnetic tape, or any other magnetic medium, a compact disk ROM (CD-ROM), a digital video disk (DVD) or any other optical medium, punch cards, paper tape, or any other physical medium with patterns of holes, a RAM, a programmable ROM (PROM), an erasable PROM (EPROM), a FLASH-EPROM, or any other memory chip or cartridge, a carrier wave, or any other medium from which a computer can read. The term non-transitory computer-readable storage medium is used herein to refer to any medium that participates in providing information to processor 802, except for carrier waves and other signals.

Logic encoded in one or more tangible media includes one or both of processor instructions on a computer-readable storage media and special purpose hardware, such as ASIC 820.

Network link 878 typically provides information communication through one or more networks to other devices that use or process the information. For example, network link 878 may provide a connection through local network 880 to a host computer 882 or to equipment 884 operated by an Internet Service Provider (ISP). ISP equipment 884 in turn provides data communication services through the public, world-wide packet-switching communication network of networks now commonly referred to as the Internet 890. A computer called a server 892 connected to the Internet provides a service in response to information received over the Internet. For example, server 892 provides information representing video data for presentation at display 814.

The invention is related to the use of computer system 800 for implementing the techniques described herein. According to one embodiment of the invention, those techniques are performed by computer system 800 in response to processor 802 executing one or more sequences of one or more instructions contained in memory 804. Such instructions, also called software and program code, may be read into memory 804 from another computer-readable medium such as storage device 808. Execution of the sequences of instructions contained in memory 804 causes processor 802 to perform the method steps described herein. In alternative embodiments, hardware, such as application specific integrated circuit 820, may be used in place of or in combination with software to implement the invention. Thus, embodiments of the invention are not limited to any specific combination of hardware and software.

The signals transmitted over network link 878 and other networks through communications interface 870, carry information to and from computer system 800. Computer system 800 can send and receive information, including program code, through the networks 880, 890 among others, through network link 878 and communications interface 870. In an example using the Internet 890, a server 892 transmits program code for a particular application, requested by a message sent from computer 800, through Internet 890, ISP equipment 884, local network 880 and communications interface 870. The received code may be executed by processor 802 as it is received, or may be stored in storage device 808 or other non-volatile storage for later execution, or both. In this manner, computer system 800 may obtain application program code in the form of a signal on a carrier wave.

Various forms of computer readable media may be involved in carrying one or more sequence of instructions or data or both to processor 802 for execution. For example, instructions and data may initially be carried on a magnetic disk of a remote computer such as host 882. The remote computer loads the instructions and data into its dynamic memory and sends the instructions and data over a telephone line using a modem. A modem local to the computer system 800 receives the instructions and data on a telephone line and uses an infra-red transmitter to convert the instructions and data to a signal on an infra-red a carrier wave serving as the network link 878. An infrared detector serving as communications interface 870 receives the instructions and data carried in the infrared signal and places information representing the instructions and data onto bus 810. Bus 810 carries the information to memory 804 from which processor 802 retrieves and executes the instructions using some of the data sent with the instructions. The instructions and data received in memory 804 may optionally be stored on storage device 808, either before or after execution by the processor 802.

Figure 9:
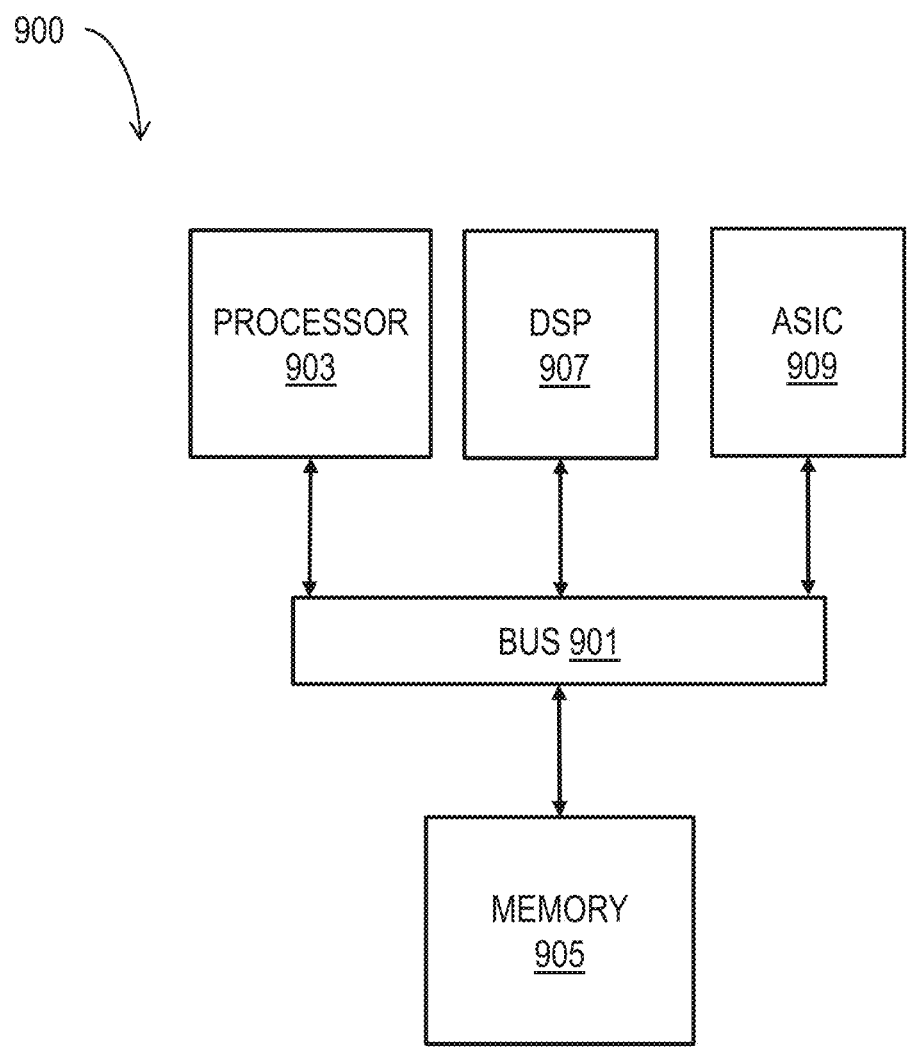
FIG. 9 illustrates a chip set upon which an embodiment of the invention may be implemented.

FIG. 9 illustrates a chip set 900 upon which an embodiment of the invention may be implemented. Chip set 900 is programmed to perform one or more steps of a method described herein and includes, for instance, the processor and memory components described with respect to FIG. 8 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 900, or a portion thereof, constitutes a means for performing one or more steps of a method described herein.

In one embodiment, the chip set 900 includes a communication mechanism such as a bus 901 for passing information among the components of the chip set 900. A processor 903 has connectivity to the bus 901 to execute instructions and process information stored in, for example, a memory 905. The processor 903 may include one or more processing cores with each core configured to perform independently. A multi-core processor enables multiprocessing within a single physical package. Examples of a multi-core processor include two, four, eight, or greater numbers of processing cores. Alternatively, or in addition, the processor 903 may include one or more microprocessors configured in tandem via the bus 901 to enable independent execution of instructions, pipelining, and multithreading. The processor 903 may also be accompanied with one or more specialized components to perform certain processing functions and tasks such as one or more digital signal processors (DSP) 907, or one or more application-specific integrated circuits (ASIC) 909. A DSP 907 typically is configured to process real-world signals (e.g., sound) in real time independently of the processor 903. Similarly, an ASIC 909 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 903 and accompanying components have connectivity to the memory 905 via the bus 901. The memory 905 includes both dynamic memory (e.g., RAM, magnetic disk, writable optical disk, etc.) and static memory (e.g., ROM, CD-ROM, etc.) for storing executable instructions that when executed perform one or more steps of a method described herein. The memory 905 also stores the data associated with or generated by the execution of one or more steps of the methods described herein.

4. ALTERATIONS, DEVIATIONS AND MODIFICATIONS

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. Throughout this specification and the claims, unless the context requires otherwise, the word "comprise" and its variations, such as "comprises" and "comprising," will be understood to imply the inclusion of a stated item, element or step or group of items, elements or steps but not the exclusion of any other item, element or step or group of items, elements or steps. Furthermore, the indefinite article "a" or "an" is meant to indicate one or more of the item, element or step modified by the article.

5. REFERENCES

The reference cited below are hereby each incorporated by reference as if fully set forth herein, except for terminology inconsistent with that used herein.

Franke, Jörg; Andreas Dobroschke. Robot-Based Winding-Process for Flexible Coil Production. Electrical Manufacturing,Coil Winding & Coating Expo Conference (emcwa) 2009, Nashville, USA, Sep. 29-Oct. 1, 2009.

Hagedorn, Jürgen; Florian Sell-Le Blanc; Jürgen Fleischer. Handbook of Coil Winding. Springer 2018.

Juchem C, Nixon T W, McIntyre S, Rothman D L, de Graaf R A. Magnetic field modeling with a set of individual localized coils. J Magn Reson. 2010; 204:281-289.

Juchem C, Green D, de Graaf R A. Multi-coil magnetic field modeling. J Magn Reson. 2013; 236:95-104.

Juchem C, Brown P B, Nixon T W, McIntyre S, Rothman D L, de Graaf R A. Multi-coil shimming of the mouse brain. Magn Reson Med. 2011; 66:893-900.

Juchem C, de Graaf R A. The public multi-coil information (PUMCIN) policy. Magn Reson Med. 2017; v78, pp 2042-2047.

Juchem C, Herman P, Sanganahalli B G, Nixon T W, Brown P B, McIntyre S, Hyder F, de Graaf R A. Dynamic Multi-Coil Technique (DYNAMITE) Shimmed EPI of the Rat Brain at 11.7 Tesla. NMR Biomed, 2014; 27:897-906.

Juchem C, Nixon T W, McIntyre S, Rothman D L, de Graaf R A. Magnetic field homogenization of the human prefrontal cortex with a set of localized electrical coils. Magn Reson Med. 2010; 63:171-180.

Juchem C, Nixon T W, McIntyre S, Boer V O, Rothman D L, de Graaf R A. Dynamic multi-coil shimming of the human brain at 7 Tesla. J Magn Reson. 2011; 212:280-288.

Juchem C, Umesh Rudrapatna S, Nixon T W, de Graaf R A. Dynamic multi-coil technique (DYNAMITE) shimming for echo-planar imaging of the human brain at 7 Tesla. Neuroimage. 2015; 105:462-472.

Juchem C, Nahhass O M, Nixon T W, de Graaf R A. Multi-slice MRI with the dynamic multi-coil technique. NMR Biomed. 2015; 28:1526-1534.

Juchem C, Nixon T W, de Graaf R A. Multi-Coil Imaging with Algebraic Reconstruction. Proc ISMRM; 2012; Melbourne, Australia, p. 2545.

Umesh Rudrapatna S, Fluerenbrock F, Nixon T W, de Graaf R A, Juchem C. Combined Imaging and Shimming with the Dynamic Multi-Coil Technique. Magn Reson Med. 2019; 81:1424-1433.

DE102008018265 B4

Snyder, A. L., Corum, C. A., Moeller, S. Powell, N. J. & Garwood, M. MRI by steering resonance through space. Magn Reson Med, 2014, v 72, pp 49-58.

Watkins, R. D., H. E. Cline, and D. A. Kelley, 2005 Matrix coil for generating a variable magnetic field US 200501100492A.

Jürgen Hagedorn, Florian Sell-Le Blanc, Jurgen Fleischer. Handbook of Coil Winding. Springer 2018.

Jörg Franke, Andreas Dobroschke. Robot-Based Winding-Process for Flexible Coil Production. Electrical Manufacturing,Coil Winding & Coating Expo Conference (emcwa) 2009, Nashville, USA, Sep. 29-Oct. 10, 2009.

What is claimed is:

1. An apparatus for performing magnetic resonance (MR) measurements, the apparatus comprising a coil unit configured for generating one or more of a gradient magnetic field and a shim magnetic field, the coil unit comprising:
   a plurality of coil windings each comprising a plurality of loops of electrically insulated electrically conducting wire, each coil winding defines a perpendicular longitudinal axis, each coil winding separated longitudinally parallel to the axis by a longitudinal gap from an adjacent coil winding, the gap configured for placement of a cooling tube; and
   a single pair of electrically conducting leads configured to cause current to flow through all of the plurality of coil windings.

2. The apparatus as recited in claim 1, wherein each coil winding is comprised of about 100 loops of the wire and the longitudinal gap is about 4 millimeters.

3. The apparatus as recited in claim 2, wherein each coil winding is roughly rectangular in shape in a plane perpendicular to the axis with an outer edge that is about 9 centimeters wide and about 14 centimeters long and an inner edge that is about 4 centimeters wide and 9 centimeters long.

4. The apparatus as recited in claim 1, wherein each coil winding is curved in at least one plane that includes the axis.

5. A system that comprises a plurality of the coil units as recited in claim 1, wherein the plurality of coil units form a shell that at least partially encloses a MR measurement space.

6. The system as recited in claim 5, further comprising a cast in which the plurality of coil units are rigidly fixed.

7. The system as recited in claim 6, wherein a corresponding plurality of lead pairs from the plurality of coil units are connected at each end to an electrical panel at one limited portion of the cast.

8. The system as recited in claim 5, further comprising a cooling tube that passes through the gap in at least one coil unit of the plurality of coil units.

9. The system as recited in claim 8, wherein each coil unit of the plurality of coil units has at least one cooling tube passing through the gap in the coil unit.

10. The system as recited in claim 9, wherein a plurality of cooling tubes that each pass through the gap in at least one coil unit are connected at a first end to a single fluid inlet fixture and at a different second end to a different single fluid outlet fixture.

11. The system as recited in claim 6, further comprising a temperature sensor disposed in the cast in thermal communication with at least one coil unit.

12. The system as recited in claim 6, wherein the cast is thermally conductive.

* * * * *